(12) United States Patent
Lam et al.

(10) Patent No.: US 10,566,057 B2
(45) Date of Patent: *Feb. 18, 2020

(54) WRITING MULTIPLE LEVELS IN A PHASE CHANGE MEMORY

(71) Applicant: INTERNATIONAL BUSINESS MACHINES CORPORATION, Armonk, NY (US)

(72) Inventors: Chung H. Lam, Peekskill, NY (US); Scott C. Lewis, Essex Junction, VT (US); Thomas M. Maffitt, Burlington, VT (US); Jack Morrish, Shelburne, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/411,807

(22) Filed: May 14, 2019

(65) Prior Publication Data

US 2019/0267086 A1    Aug. 29, 2019

Related U.S. Application Data

(63) Continuation of application No. 15/812,213, filed on Nov. 14, 2017, now Pat. No. 10,424,375, which is a
(Continued)

(51) Int. Cl.
*G11C 11/00* (2006.01)
*G11C 13/00* (2006.01)
*G11C 11/56* (2006.01)

(52) U.S. Cl.
CPC ...... *G11C 13/0069* (2013.01); *G11C 11/5678* (2013.01); *G11C 13/0004* (2013.01);
(Continued)

(58) Field of Classification Search
CPC ............ G11C 13/0069; G11C 11/5678; G11C 13/0004; G11C 13/0026
(Continued)

(56) References Cited

U.S. PATENT DOCUMENTS 5,394,362 A    2/1995   Banks
5,761,114 A    6/1998   Betin et al.
(Continued)

FOREIGN PATENT DOCUMENTS

CN    101329907    12/2008
WO    2008027691    3/2008
WO    2010002942    1/2010

OTHER PUBLICATIONS

Yang, C. et al., "Multi-Tiered Approach to Improving the Reliability of Multi-Level Cell PRAM", Signal Processing Systems (SiPS), IEEE, Oct. 17-19, 2012, pp. 114-119.
(Continued)

*Primary Examiner* — Vu A Le
(74) *Attorney, Agent, or Firm* — Steven Meyers; Andrew M. Calderon; Roberts Mlotkowski Safran Cole & Calderon, P.C.

(57) ABSTRACT

Structures and methods for a multi-bit phase change memory are disclosed herein. A method includes establishing a write-reference voltage that incrementally ramps over a write period. The increments of the write-reference voltage correspond to discrete resistance states of a storage cell of the multi-bit phase change memory.

12 Claims, 23 Drawing Sheets

Related U.S. Application Data continuation of application No. 14/157,605, filed on Jan. 17, 2014, now Pat. No. 9,911,492.

(52) U.S. Cl.
CPC ........ *G11C 13/004* (2013.01); *G11C 13/0026* (2013.01); *G11C 2013/0054* (2013.01); *G11C 2013/0066* (2013.01); *G11C 2013/0078* (2013.01); *G11C 2013/0092* (2013.01)

(58) Field of Classification Search
USPC ........................................................ 365/163
See application file for complete search history.

(56) References Cited

U.S. PATENT DOCUMENTS

| | | | |
|---|---|---|---|
| 5,969,987 | A | 10/1999 | Blyth et al. |
| 6,392,931 | B1 | 5/2002 | Pasotti et al. |
| 7,142,464 | B2 | 11/2006 | Dadashev |
| 7,254,059 | B2 | 8/2007 | Li et al. |
| 7,580,297 | B2 | 8/2009 | Nirschl et al. |
| 7,660,147 | B2 | 2/2010 | Chao et al. |
| 7,729,163 | B2 | 6/2010 | Ramani et al. |
| 8,027,186 | B2 | 9/2011 | Gutala et al. |
| 8,605,497 | B2 | 12/2013 | Lam et al. |
| 8,717,802 | B2 | 5/2014 | Lam et al. |
| 8,897,063 | B2 | 11/2014 | Jurasek et al. |
| 8,953,360 | B2 | 2/2015 | Bedeschi |
| 9,153,318 | B2 | 10/2015 | Yim |
| 9,165,644 | B2 | 10/2015 | Kamalanathan et al. |
| 9,257,639 | B2 | 2/2016 | Kim et al. |
| 9,437,257 | B2 | 9/2016 | Yang et al. |
| 9,911,492 | B2 * | 3/2018 | Lam .................... G11C 11/5678 |
| 2008/0180042 | A1 * | 7/2008 | Smith ................ H05B 33/0818 |
| | | | 315/307 |
| 2009/0040815 | A1 | 2/2009 | Kang et al. |
| 2010/0073999 | A1 | 3/2010 | Kitai et al. |
| 2010/0080041 | A1 | 4/2010 | Tonomura |
| 2010/0118593 | A1 | 5/2010 | Cho et al. |
| 2011/0069539 | A1 | 3/2011 | Eleftheriou et al. |
| 2011/0242884 | A1 | 10/2011 | Eleftheriou et al. |
| 2012/0063195 | A1 | 3/2012 | Lam et al. |
| 2013/0163320 | A1 | 6/2013 | Lam et al. |
| 2013/0163322 | A1 | 6/2013 | Lam et al. |
| 2014/0078821 | A1 | 3/2014 | Hendrickson |
| 2018/0068725 | A1 * | 3/2018 | Lam .................... G11C 11/5678 |

OTHER PUBLICATIONS

Dong, X. et al., "AdaMS: Adaptive MLC/SLC Phase-Change Memory Design for File Storage", Design Automation Conference (ASP-DAC), 16th Asia and South Pacific, Jan. 25-28, 2011 pp. 31-36.
Office Action in related U.S. Appl. No. 15/989,472 dated May 10, 2019, 10 pages.
Notice of Allowance in related U.S. Appl. No. 15/812,213 dated May 8, 2019, 5 pages.
Office Action in related U.S. Appl. No. 16/411,844 dated Jul. 11, 2019, 8 pages.
Office Action in related U.S. Appl. No. 15/989,481 dated Oct. 2, 2019, 8 pages.
Notice of Allowance in related U.S. Appl. No. 15/989,472 dated Aug. 28, 2019, 11 pages.

* cited by examiner

WRITING MULTIPLE LEVELS IN A PHASE CHANGE MEMORY

FIELD OF INVENTION

The present disclosure relates to phase change memory devices. More specifically, the present disclosure relates to a PCM architecture and processes for storing information within that architecture.

BACKGROUND

Phase-change memory (a.k.a., "PCM" or "PRAM") is a type of nonvolatile memory that stores information using phase change materials. Phase change materials can change between a crystalline state and amorphous state. The crystalline state has a low electrical resistance in comparison to the amorphous state. To change from the crystalline state to the amorphous state, a current is passed through a phase change material to melt it via internal joule heating, and then a quench is performed. A change from the amorphous state to the crystalline state involves driving a phase change material to electrical breakdown, and annealing it using electrical current. Data can be stored and read from the phase change material based on its programmed electrical resistance.

By the above process, multiple bits of information may be stored in a single storage cell of a phase change material to provide a "multi-bit phase change memory" (i.e., "multi-bit PCM"). In a multi-bit PCM, each storage cell can be set with a resistance state selected from a range corresponding to various intermediate states between the crystalline state and the amorphous state. For example, different resistance states (e.g., R1, R2, R3, and R4) can represent to different binary values (e.g., 00, 01, 10, and 11).

Current implementations of multi-bit PCMs use a combination of analog-to-digital converters (ADCs) and digital to analog converters (DACs). However, these implementations are very slow for reading and even slower for writing. In addition, the ADCs and DACs require a large amount of chip area.

SUMMARY

In an aspect of the invention, there is a method for a multi-bit phase change memory. The method includes establishing a write-reference voltage that incrementally ramps over a write period. Increments of the write-reference voltage correspond to discrete resistance states of a storage cell of the multi-bit phase change memory.

In another aspect of the invention there is a method for storing information in a multi-bit phase change memory. The method includes writing an initial write value in a storage cell of the multi-bit phase change memory. The storage cell has a predetermined range of discrete resistance states. The initial write value is a predetermined value at the midpoint of the range. The method also includes reading a value stored in the storage cell by the writing. The method further includes comparing the value stored in the storage cell to a target value. Additionally, the method includes adjusting the value stored in the storage cell based on the comparing.

In another aspect of the invention there is a phase change memory system comprising a storage cell, a read head, and a write head. The read head retrieves information stored in the storage cell using a read-reference voltage that incrementally ramps over a read period. The write head stores information in the storage cell using a write-reference voltage that incrementally ramps over a write period.

In another aspect of the invention, a design structure tangibly embodied in a machine readable storage medium for designing, manufacturing, or testing an integrated circuit is provided. The design structure comprises structures associated with a predefined minimum feature size and a predefined minimum spacing size. In further embodiments, a hardware description language (HDL) design structure encoded on a machine-readable data storage medium comprises elements that when processed in a computer-aided design system generates a machine-executable representation of the multi-bit PCM of the present invention. In still further embodiments, a method in a computer-aided design system is provided for generating a functional design model of the multi-bit PCM of the present invention. The method comprises generating a functional representation of the multi-bit PCM of the present invention.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

Figure 1:
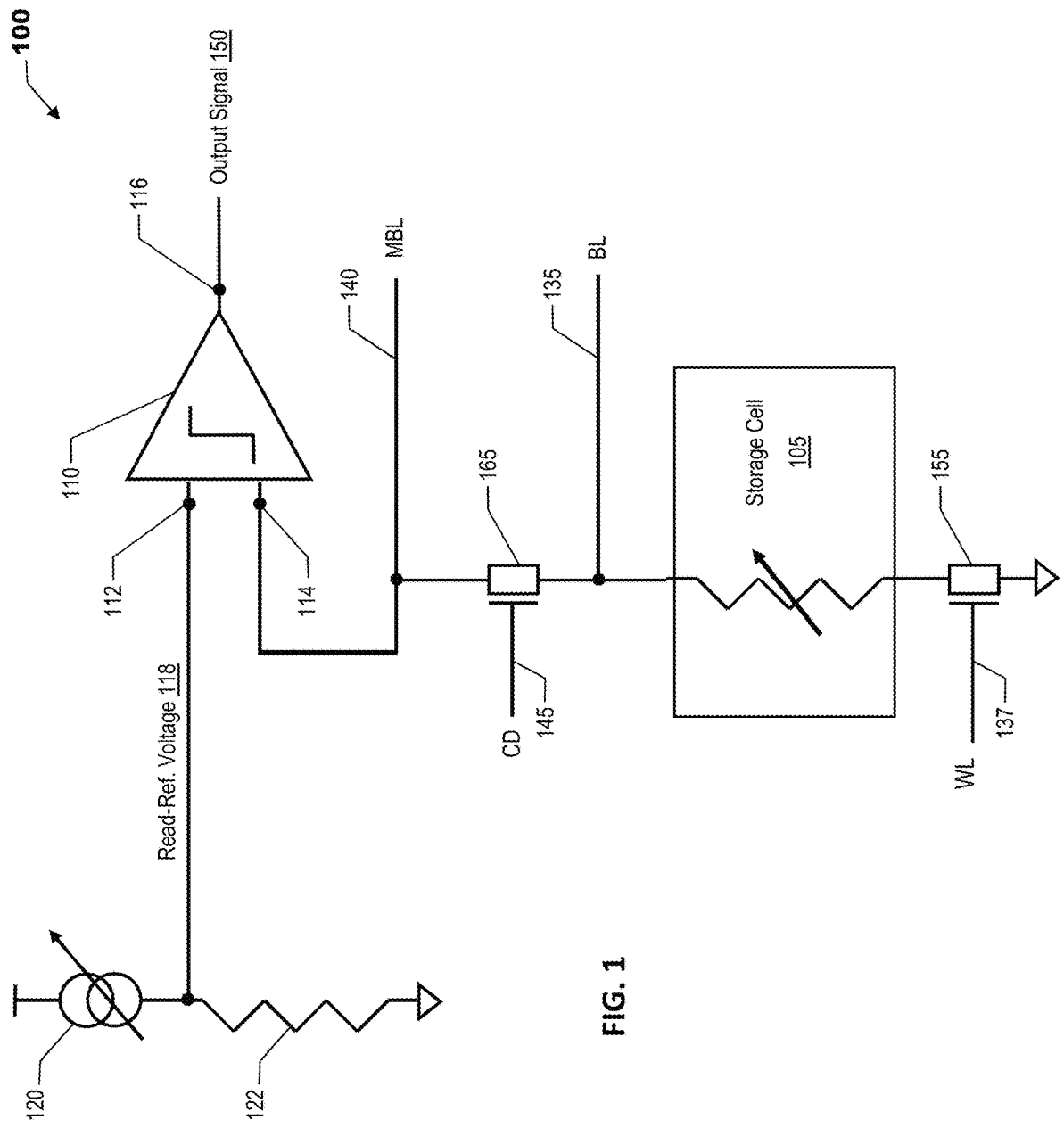
FIG. 1 shows an exemplary read head of a multi-bit PCM in accordance with aspects of the invention.

The present disclosure relates to PCMs. More specifically, the present disclosure relates to a PCM architecture and processes for storing information within that architecture. A PCM architecture in accordance with aspects of the present invention writes information in PCM storage cells by establishing a current ramp which changes its value over a predetermined write time period. The write time period is broken into equal time increments (e.g., 64 increments of 1.5 ns), wherein each increment corresponds to a digital write current value. A target value to be stored in the storage cell is compared to the digital write current value. At an increment when the values are equal, the ramped current is directed through the storage cell, which stores the target value in the storage cell by changing its physical state and, thereby, its electrical resistance.

In a read operation, a current ramp generates a read-reference voltage for a sense comparator over a predetermined read time period. The read time period is broken into the same number of time increments as the write time period. When the voltage across the storage cell equals the reference voltage, the sense comparator triggers. The time increment at which the sense comparator triggers corresponds to the value in the storage cell.

Due to physical and operational variations among storage cells of PCMs, storing information in a particular storage cell can involve multiple read and write iterations to adjust the stored information such that the actual value stored by the storage cell (i.e., a read value) reflects the intended value (i.e., a target value). In other words, multiple write iterations may be performed to provide sufficient certainty that a value written to a particular storage cell matches the value that will be read from that cell. In accordance with aspects of the invention, the write operation is self-calibrating. That is, the write operation performs an iterative process wherein it writes a first, nominal value in the center of the expected write range of the storage cell (e.g., 32 in a range 0-63). A read operation follows the write operation to determine whether the value read in the storage cell is lower than the target value (e.g., lower than 32). A number of subsequent write/read operations are performed that compare the intermediate values stored by preceding write iterations with the target value. By doing so, the write operation rewrites the cell over a number of iterations such that the final value stored is reliably an input value.

Additionally, in accordance with aspects of the invention, the multi-bit PCM architecture uses only DACs for performing read and write operations, without using ADCs for reading and writing. Based on digital inputs, a DAC generates a reference current for the read operation and a DAC (which may be the same or different than the first) generates a reference current for the write operation. In embodiments, the DACs output current ramps that generate reference voltages for the read and write operations. The lack of ADC's in the architecture reduces the area of PCMs in semiconductor chips. For example, a multi-bit PCM in accordance with the instant invention can be implemented a chip area that is 10% smaller or less than a conventional PCM that employs ADCs.

FIG. 1 shows an exemplary read head 100 for reading information from a storage cell 105 of a multi-bit PCM in accordance with aspects of the invention. The read head 100 includes a sense comparator 110 having a first input 112, a second input 114, and an output 116. The sense comparator 110 can be, in embodiments, a device adapted and/or configured to change logic states (e.g., from a high logic state to a low logic state) when the first input 112 and the second input 114 are the same or substantially the same (e.g., within about 10 mV of one another).

The first input 112 of the sense comparator 110 receives a read-reference voltage 118 that is ramped (e.g., increases) over a predetermined read period. The read-reference voltage 118 can be generated by a controllable current source 120. In accordance with aspects of the invention, the controllable current source 120 is a DAC and the read head 100 does not include any ADCs. The DAC is configured and/or adapted to generate a current that is incrementally ramped over a predetermined range (e.g., 0.5 V to 1.5 V), wherein the increments are equal divisions (i.e., time intervals) of the read period (e.g., 100 ns). Each of the increments corresponds to a discrete resistance state of the storage cell 105. In embodiments, the read-reference voltage 118 is ramped in 64 increments having a respective voltage level (e.g., a 15 mV step) that corresponds to 64 different resistance states of the storage cell 105. For example, at the 40th time increment, the 40th voltage step of the read-reference voltage 118 can correspond to a 40th resistance state of the storage cell 105. Based on this correspondence, a value stored in the storage cell 105 is retrieved.

The second input 114 of the sense amplifier 110 is electrically connected to the storage cell 105. The storage cell 105 maybe associated with conventional memory lines so that it can be selected within an array of storage cells for reading and writing. More specifically, the storage cell 105 may be associated with a bit line ("BL") 135, a word line ("WL") 137, a master bit line ("MBL") 140, and a column decoder line ("CD") 145. The word line 137 selectively connects the storage cell 105 to ground voltage via transistor 155. The column decoder 145 selectively connects the storage cell 105 and the bit line 135 to the master bit line 140 via transistor 165. The storage cell 105 is selected for reading by the bit line 135, the word line 137, and the column decoder 145 such that a voltage corresponding to the value of the storage cell 105 is produced on master bit line 140 due to the voltage across the storage cell 105 based on its resistance state. Because the resistance state of the storage cell 105 is selectively set to one of a number of predefined values, its resistance can be interpreted as information (e.g., a combination of data bits).

In accordance with aspects of the invention, the read head 100 performs a read operation as follows. Upon initiation of the read operation, the current source 120 incrementally ramps the read-reference voltage 118 from a first predetermined voltage to a second predetermined voltage over a predetermined read period (i.e., time). At one of the time increments of the read-reference voltage 118, a voltage on the master bit line 140 at the input of the sense comparator 114 (due to the bit line 135 and the resistance of the storage cell 105) is the same or substantially the same (e.g., ±10 mV) as the voltage at the input 112 (due to the current source 120 and the resistance across resistor 122). At that time increment, a output signal 150 at the output 116 sense comparator 110 changes logic state (e.g., from high to low). The value of the time increment indicates the resistance state of the storage cell 105. That is, the increment of the read-reference voltage 118 at which the sense comparator 110 changes logic state (i.e., triggers) corresponds to the value stored in the storage cell 105. For example, the current source 120 can ramp-up in 64 time increments (i.e., 0-63). If the read output value 150 at output 116 changes logic states at time increment 40, the value stored in the storage cell 105 would be interpreted to be 40.

Figure 2:
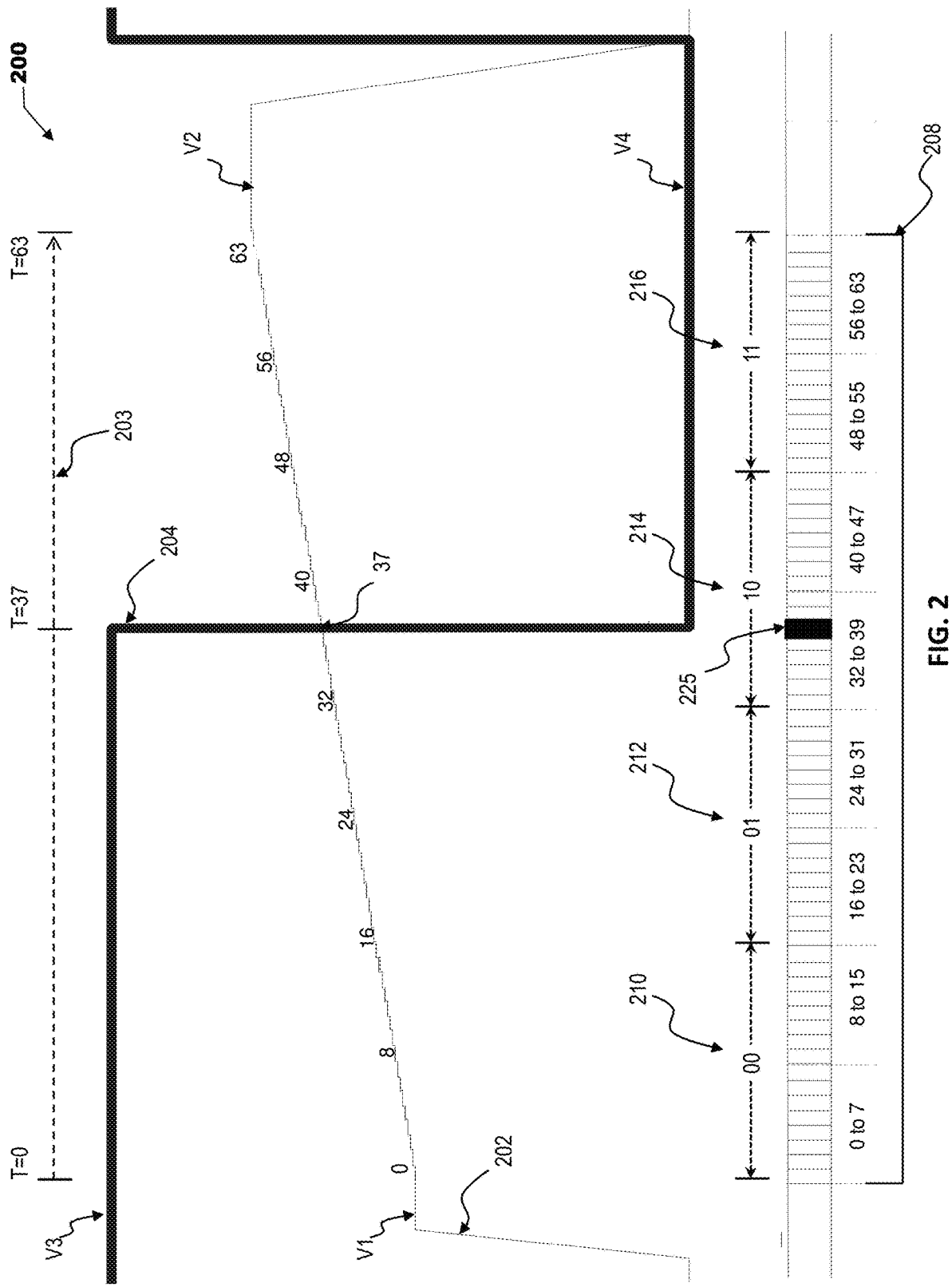
FIG. 2 illustrates a read operation by an exemplary read head of a multi-bit PCM in accordance with aspects of the invention.

FIG. 2 illustrates a read operation 200 for a storage cell (e.g., storage cell 105) performed by a read head (e.g., read head 100) in accordance with aspects of the invention. Line 202 represents a read-reference voltage (e.g., read-reference voltage 118) during an exemplary read process. Line 203 represents a predetermined read period over which the read-reference voltage is incrementally ramped. Line 204 represents an output signal (e.g., output signal 150) of a sense comparator (e.g., sense comparator 110) that compares the read-reference voltage and a voltage across the storage cell. Line 208 represents the range of resistance states to which the storage cell can be programmed (i.e., recorded or written).

In accordance with the exemplary embodiment shown in FIG. 2, the read-reference voltage (i.e., line 202) is ramped-up in 64 steps (i.e. step 0 to step 63) from a first voltage V1 (e.g., 0.5 V) to a second voltage V2 (e.g., 1.5 V). The increments 0-63 of the read-reference voltage correspond to the 64 time increments (i.e., time increments 0-63) of the time range (i.e., line 203) in the 64 resistance states of the storage cell (i.e., line 208). In embodiments, each time increment corresponds to a step-wise increase (e.g., by current source 120) in the read-reference voltage. When the read-reference voltage and the voltage across the storage cell are the same, or substantially the same (e.g., ±10 mV) at time increment 37, the sense comparator triggers. As such, its output (i.e., line 204) switches from a first logic level V3 (e.g., 1.0 V) to a second logic level V4 (e.g., 0.0V), which corresponds to programmed resistance state 225 of the storage cell.

In accordance with aspects of the invention, the storage cell can be programmed to have one of a number of discrete resistance states. As indicated by divisions 0-63 of line 208, embodiments of the storage cell has 64 (i.e., 0-63) resistance states. The divisions 208 of the 64 discrete resistance states can be grouped into ranges (i.e., buckets) of values 210, 212, 214, and 216. Each of the ranges of values 210, 212, 214, and 216 can correspond to a value stored in the storage cell 105. For example, in the example shown in FIG. 2, resistance states 0 . . . 15 correspond to binary value 00, resistance states 16 . . . 31 correspond to binary value 01, resistance states 32 . . . 47 correspond to binary value 10, and resistance states 48 . . . 63 correspond to binary value 11. It is understood that the number of steps and the number of values, as well as their respective ranges and divisions shown in FIG. 2 are provided for example, and that other steps, values, and divisions can be used in embodiments of the present invention.

Still referring to FIG. 2, the 64 steps of the read-reference voltage (i.e., line 202) respectively correspond to the 64 time increments of line 208 and the 64 resistance states 208 of the storage cell. Thus, by determining the time increment at which the output of the sense comparator switches from voltage level V3 to voltage level V4, the resistance state 225 of the storage cell can be determined and the corresponding one of the values 210, 212, 214, and 216 can be interpreted. In the example shown in FIG. 2, the resistance state 225 of the storage cell has a value of 37. Prior to time increment 0, the output of a sense comparator is initialized to the voltage level V3. At time increment 0, a read operation begins and the read-reference voltage is incrementally ramped from voltage V1 to voltage V2 in steps 0 to 63. During the voltage increments 0-36 (and correspondingly time increments 0-36), there is no match between the read-reference voltage and voltage across the storage cell. As such, the output of the sense comparator remains at the first voltage level V3 during time increments 0-36. However, at voltage increment 37 (and, correspondingly, time increment 37), the sense comparator determines that the read-reference voltage is the same or substantially the same (e.g., ±10 mV) as the voltage due to the resistance state 225 of the storage cell. As a result, the output of the sense comparator changes from voltage level V3 to voltage level V4. Since this event occurs at time increment 37, the resistance state 225 of the storage cell can be interpreted to be 37, which is in the range 214 that corresponds to a stored value of 10.

Figure 3:
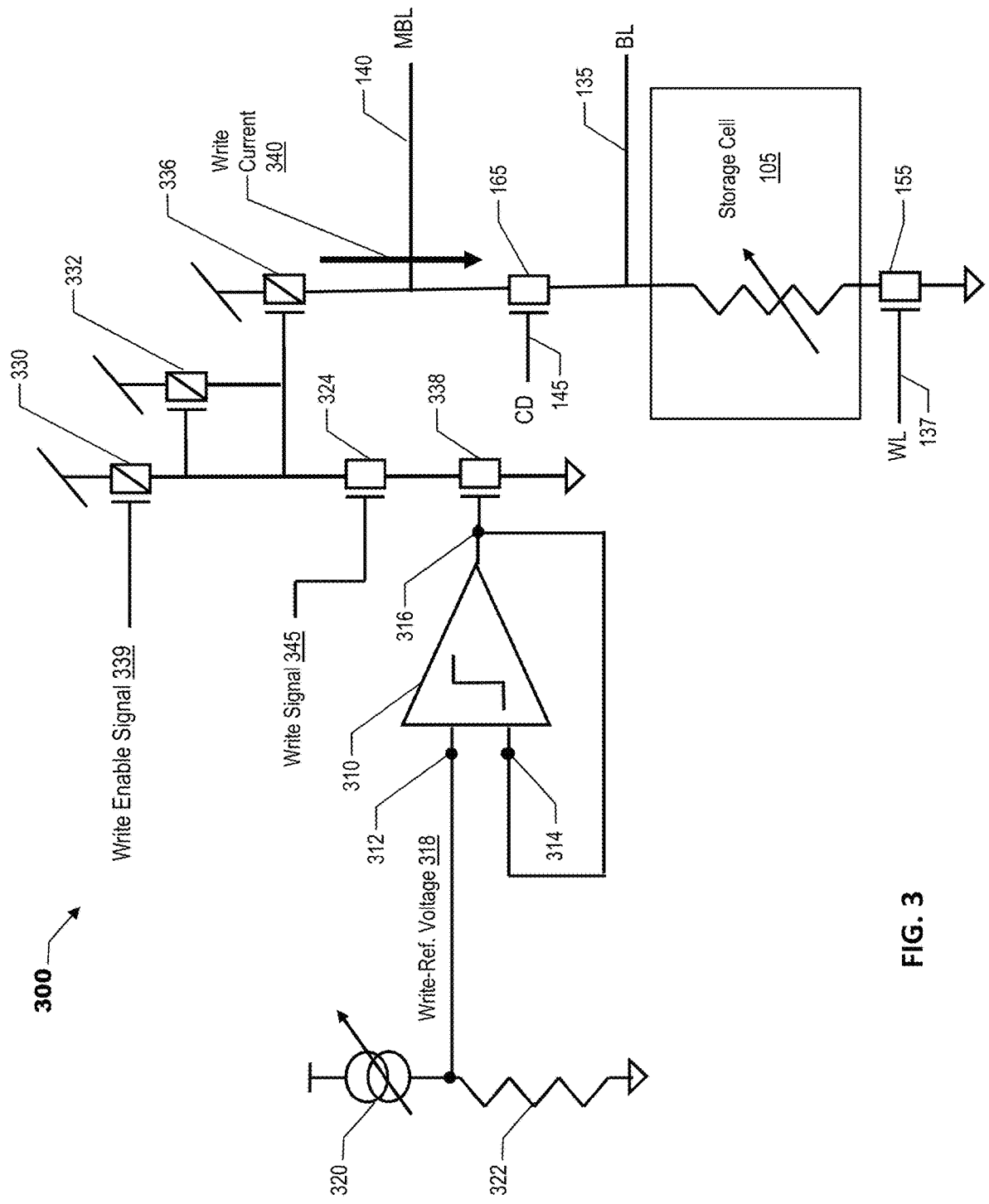
FIG. 3 shows an exemplary write head of a multi-bit PCM in accordance with aspects of the invention.

FIG. 3 shows an exemplary write head 300 for storing information in a multi-bit PCM in accordance with aspects of the invention. The write head 300 includes a buffer 310 having a first input 312, a second input 314, and an output 316. The buffer 310 can be, in embodiments, configured and/or adapted as a unity gain amplifier by tying the output 316 to the second input 314. The first input 312 of the buffer 310 receives a write-reference voltage 318 that incrementally ramps (e.g., increases) from a first voltage to a second voltage over a predetermined write period. The write-reference voltage 118 can be generated by a controllable current source 320. In accordance with aspects of the invention, the controllable current source 320 is a DAC and the write head 300 does not include any ADCs. The DAC is configured and adapted to generate a current that incrementally ramps-up over a predetermined range (e.g. 0.0 V to 1.5 V), wherein the increments are equal time divisions (e.g., 1.5 ns) of the write period (e.g., 100 ns). Each of the increments corresponds to one of the discrete resistance states of the storage cell 105. Additionally, at the output 316 of the buffer 310, there are transistors 165, 324, 330, 332, 336, and 338 that together selectively provide a write current 340, the store a value in the storage cell 105.

In accordance with aspects of the invention, writing with different current levels over a wide range using identical pulse widths will, over a desired range, yield monotonic results with larger currents causing larger values of resistance to be given to the storage cell 105. During a write operation, writing is initiated by a write enable signal 339, the bit line 135, the word line 137, and the column decoder 145 in a conventional manner. The write-reference voltage 318 is ramped over the predetermined range by the current source 320. A write signal 345 provided to transistor 324 pulses during a specific write current ramp step to write the storage cell 105 to a corresponding resistance state. The pulse of the write signal 345 can be triggered based on a clock or a counter at the target value corresponding to an increment of the write-reference voltage 318. For example, a clock or a counter may count time increments from (e.g., 0-63) corresponding to the steps of the write-reference voltage (e.g., 0-63), and trigger the pulse at a particular time increment (e.g., 32) corresponding to a target voltage (e.g., 0.75 V).

In accordance with aspects of the invention, the write head 300 is configured and/or adapted as a current mirror via transistors 332 and 336, wherein the current driven through transistor 338 is reflected as a write current 340 that is driven through the storage cell 105. The flow of write current 340 can be controlled by the word line 137. That is, the word line 137 is either on or off (1 V or 0 V) to control transistor 155 as a switch.

Figure 4:
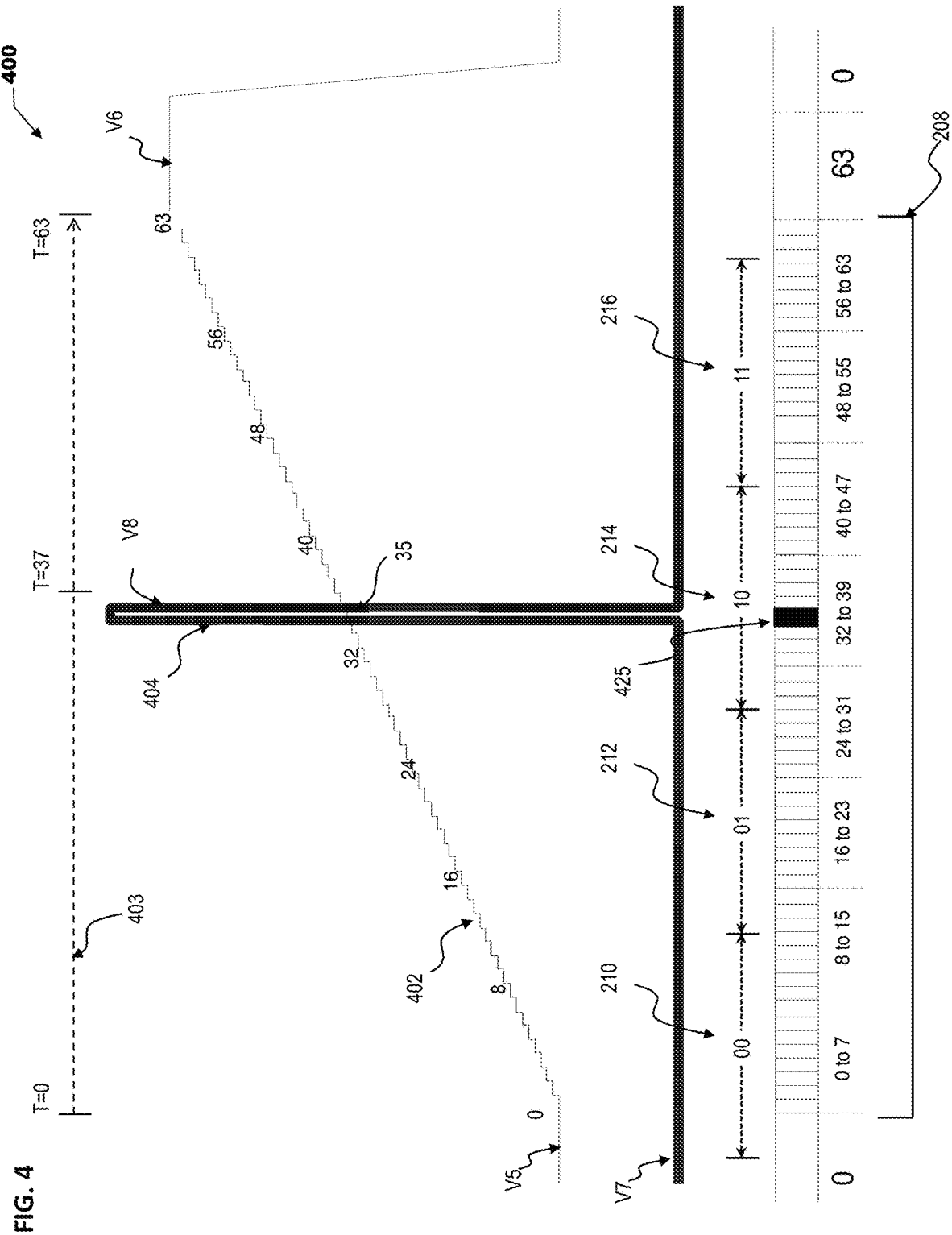
FIG. 4 illustrates a write operation by an exemplary write head of a multi-bit PCM in accordance with aspects of the invention.

FIG. 4 illustrates an exemplary write operation 400 for a storage cell (e.g., storage cell 105) performed by a write head (e.g., write head 300) in accordance with aspects of the invention. Line 402 represents a write-reference voltage (e.g., write-reference voltage 318) that is ramped over a predetermined number steps (e.g., 64 steps) from a first voltage V5 (e.g., 0.0 V) to a second voltage V6 (e.g., 1.5 V). Line 403 represents a predetermined write time period over which the write-reference voltage is ramped. For example, the write time may be kept by a clock or counter, wherein each increment 0-63 of the write period corresponds to a step-wise increase (e.g., by current source 320) in the write-reference voltage. Line 404 represents a write signal (e.g., write signal 345), that pulses at a particular time increment to store a value in the storage cell by setting a corresponding resistance state of the storage cell. Line 208 represents the range of resistance states to which the storage cell can be set (i.e., recorded or written) based on the write-reference voltage.

In the example shown in FIG. 4, a target resistance state 425 of the storage cell has a value of 35. Initially, the write signal (i.e., line 404) is in a low logic state (e.g., 0.0 V) as write-reference voltage 318 (i.e., line 402) ramps from V5 to V6 over steps 0-63 corresponding to time increments 0-63. At time increment 35 and step 35 of the write-reference voltage, which correspond to the value to be recorded in the storage element, the write signal pulses from a low logic state V7 (e.g., 0.0 V) to a high logic state V8 (e.g., 1.0 V) to store the value in the storage cell. As is evident in FIG. 4, the resistance state 425 of step 35 is in range 214 of the 64 resistance states of the storage cell (i.e., line 208), which corresponds to the binary value 10 being stored in the storage cell.

Figure 5:
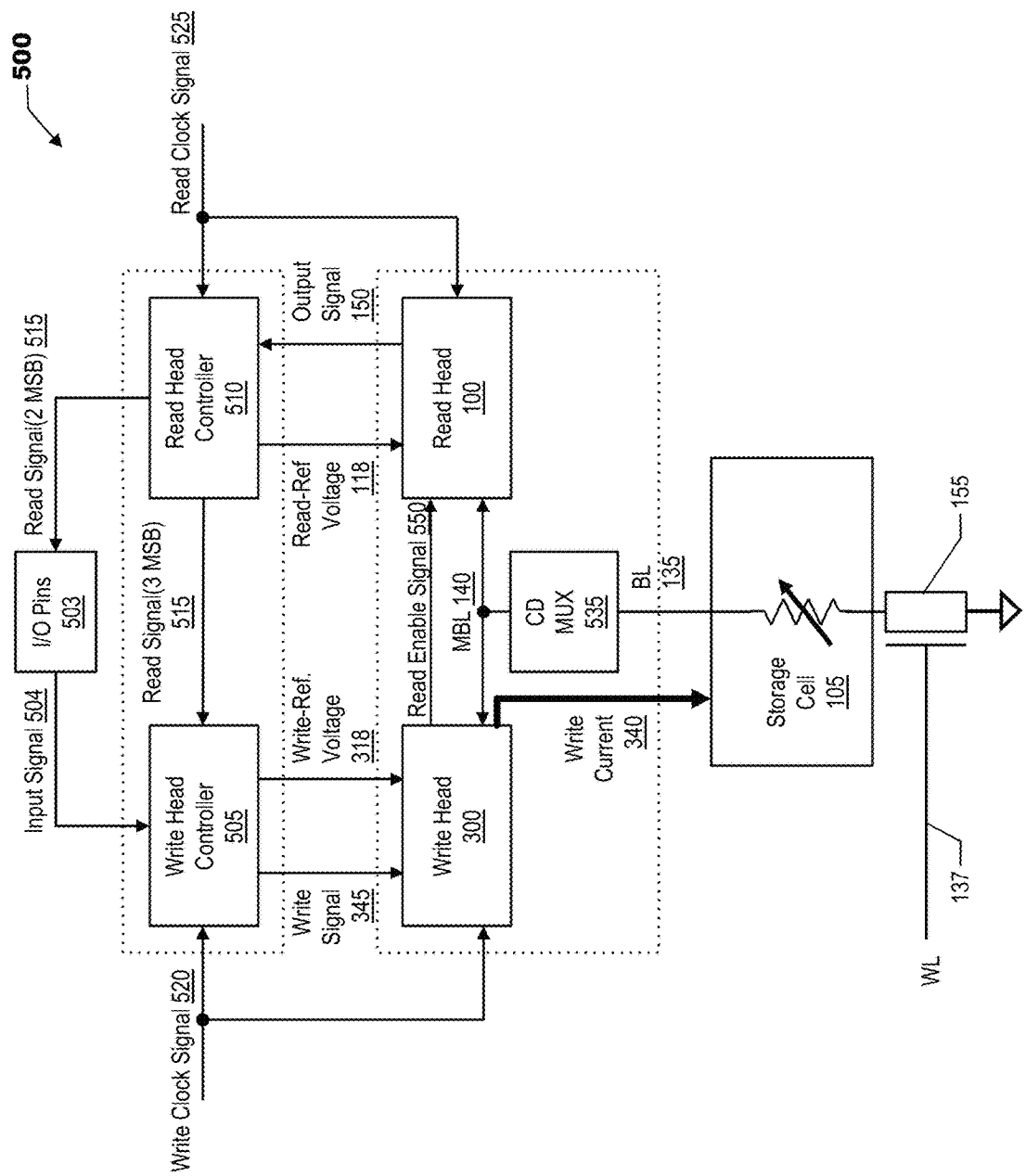
FIG. 5 shows an exemplary system for a multi-bit PCM in accordance with aspects of the invention.

FIG. 5 shows an exemplary system 500 for writing information to and reading information from the storage cell 105 in accordance with aspects of the present invention. The system 500 stores a value of an input signal 504 to the storage cell 105 in an iterative process of writing and reading. The system 500 includes the storage cell 105, the read head 100, the write head 300, input/output pins 503, a write head controller 505, a read head controller 510, and a column decoder ("CD") multiplexer 535.

While the example shown in FIG. 5 includes one storage cell 105, multi-bit PCMs in accordance with aspects of the invention can include large, addressable arrays of such storage cells that are written and read by write control heads and read control heads which are the same or similar to write head controller 505 and read head controller 510.

The input/output pins 503 correspond to the storage element 105. In embodiments, there are two input/output pins 503 that that receive the input value from, e.g., a memory controller, and provide it as the input signal 504 to the write head controller 505. Memory controllers that send and receive information from memory are conventional in computer processing systems and are understood by those having ordinary skill in the relevant art such that further explanation is not required for such artisans to make and use the invention. In embodiments, the input signal 504 includes 2-bits of data corresponding to one of four possible input values (e.g., 00, 01, 10, and 11 in binary). It is understood, however, that embodiments of the invention are not limited to two pins or 2-bits of data, and that other embodiments may user more pins (e.g., 3 or more pins that carry 3 or more bits of data). Further, a number of storage cells can be used together to store words that are greater than 2-bits. For example, four storage cells may each store 2-bits of an 8-bit word.

The write head controller 505 is a device, software, or a combination thereof that determines a target value for the storage cell 105 based on an input value provided by the input signal 504. The target value is used to control the writing of the storage cell 105 to one of the range of resistance states by the write head 300. In accordance with aspects of the invention, each target value corresponds to at least one of the resistance states of the storage cell 105. In embodiments, the range of resistance states of the storage cell 105 is greater than the range of input values. For example, the range of resistance states can include 64 discrete resistances 000000 to 111111 in binary notation (i.e., 0-63 in decimal notation), and the range of input values can include values 00 to 11 (i.e., 0-3 in decimal notation). Thus, each resistance state of the storage cell 105 can correspond to a 6-bit value, whereas each input value can correspond to a 2-bit value. Accordingly, in embodiments, the write head controller 505 translates the 2-bit input value to a 6-bit value. For example, the write head controller 505 can convert the input values 00, 01, 10, and 11 (i.e. 0, 1, 2, and 3 in decimal notation) to target values of 001000, 011000, 101000, and 111000 (i.e., 8, 24, 40, and 56 in decimal notation), respectively. By providing a range of resistance states for each input value, the system 500 provides a margin of error between the different input values that may be stored in the storage cell 105. In embodiments, the write head controller 505 translates the input value to a target value by adding the received input value with the bits 1000. For example, an input value of 10 can be added to provide a target value of 101000 (i.e., 40 in decimal). However, other methods of translation may be used in embodiments of the invention. For example, the write head controller 505 may use a lookup table that maps input values to target values.

Additionally, the write head controller 505 determines a write value of the write signal 345 for writing to the storage cell 105. In accordance with aspects of the invention, the write head controller 505 triggers a pulse of the write signal 345 based on the target value (e.g., in a manner similar to that described with respect to line 404 in FIG. 4). The write head controller 505 can determine the write value based on the target value based on a write value from a previous write iteration during a write process. For example, the write control 505 head increases or decreases the write value from an immediately preceding write iteration based on comparison of a value read from the storage cell 105 after the immediately preceding write iteration and the target value. By doing so, the system 500 iteratively adjusts the target value written to the storage cell 105 over several write iterations.

Still referring to FIG. 5, the read head controller 510 is a device, software, or a combination thereof that receives the read output signal 150 from of the read head 100 and determines a value of the information stored in the storage cell 105. In embodiments, the read output signal 150 of the read head 100 changes states when the current step of the read-reference voltage 118 (e.g. 0-63) corresponds to the resistance state (e.g., 0-63) of the storage cell 105. For example, a comparator (e.g., comparator 110) triggers when the ramped read-reference voltage 118 is the same (or substantially the same) as the voltage across the storage cell 105 due to its programmed resistance state. Thus, based on the time at which the read output signal 150 changes states (e.g., 35), the read head controller 510 determines (i.e., retrieves) the corresponding value stored by the storage cell 105 (e.g., 35).

Additionally, in accordance with aspects of the invention, the read head controller 510 provides a read signal 515 to the write head controller 505 that feeds back the value of the storage cell 105 for use in the determining write values in iterations of a write process. In embodiments, the read head controller 510 provides only the most significant bits (e.g., the three most significant bits) of the value of the storage cell in the read signal 515. Additionally, the read head controller 510 provides the read signal 515 to the input/output pins 503 as an output to, e.g., a memory controller. In embodiments, the read head controller 510 provides only the most significant bits (e.g., the two most significant bits) in the read signal 515, which represent a 3-bit value (e.g., 00, 01, 10, and 11) of the value stored in the storage cell 105.

The write head 300 is a device, software, or a combination thereof that writes information to the storage cell 105 by programming it with a selected resistance state. The write head 300 may be the same or similar the one shown in FIG. 3. During a write operation within a write process, the write head 300 generates ramped write reference voltage 318 that provides the write current 340 to the storage cell 105. The write signal 345 triggers the write current 340, which stores the target value in the storage cell 105 based on the value of the write reference voltage 318 at the write value determined by the write head controller 505. For example, when the write value is 40, the write head controller 505 controls the write signal 345 to pulse at voltage step 40 of the write-reference voltage 318. The write head controller 505 may determine the timing of the pulse for the write signal 345 based on a write clock signal 520 that drives a counter in the write head controller, wherein the counter is synchronized with the steps of the write-reference voltage 318. In embodiments, both the write head controller 505 and the write head 300 receive the write clock signal 520 such that a counter maintained by the write head controller 505 is synchronized with the write-reference voltage 318 (i.e. time increments 0-63 correspond to voltage steps 0-63).

The read head 100 is a device, software, or a combination thereof that reads the storage cell 105 by determining its resistance state. The read head 100 may be the same or similar to the read head 100 in FIG. 1. During a read operation within a write process, the read head 100 applies a voltage to the master bit line 140, and compares voltage across the storage element 105 due to its programmed resistance with the ramped read-reference voltage 118. That is, the output signal 150 of the read head 100 changes logic states when these two voltages are the same. The read head controller 510 determines the value stored in the storage cell 105 based on a time increment (e.g. 35 in decimal) at which the read head output signal 150 changes states (i.e., triggers). To determine the time increment, the master read head 510 can receive a read clock signal 525 that drives a counter maintained by the read head controller 510, and that is synchronized with the time increments of the read-reference voltage 118 based on read clock signal 525. In embodiments, both the read head controller 510 and the read head 100 receive the read clock signal 525 such that a counter maintained by the read head controller 510 is synchronized with the read-reference voltage 318 (i.e. time increments 0-63 correspond to voltage increments 0-63).

The column decoder line multiplexer (i.e., "CD Mux") 535 includes transistor 165 that receives column decoder line 145. Additionally, column decoder line multiplexer 535 can include control logic that selectively controls electrically connections of the read head 100 and the write head 300 to the storage cell 105 such that they are not connected at the same time. For example, the control logic may connect the write head 300 or the read head 100 based on the state of a write enable signal (e.g., write enable signal 339) and the read enable signal 550.

Figure 6:
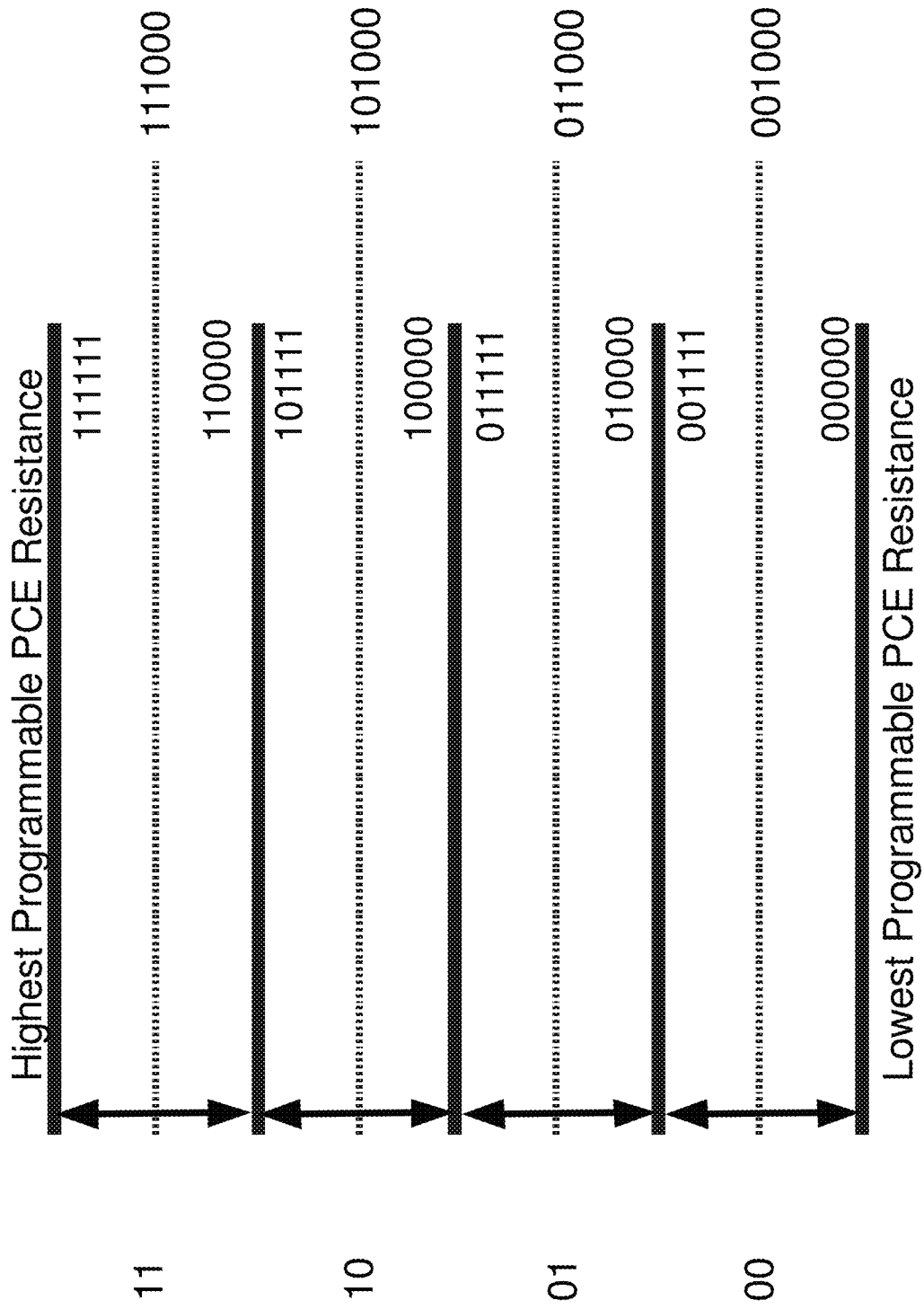
FIG. 6 illustrates a process for translating a value in a multi-bit PCM in accordance with aspects of the invention.

FIG. 6 illustrates a process for translating an input value to a target value in accordance with embodiments of the invention. In embodiments, the translation is performed by a device (e.g., write head controller 505) using hardware, software, or a combination thereof. In embodiments, 2-bit input value (e.g., from input signal 504) is stored in a storage cell (e.g., storage cell 105) that is configured and/or adapted to have 64 discrete resistance states (e.g., 000000-111111 in binary notation), wherein each resistance state is associated with a target value (e.g., 000000-111111 in binary notation). As such, the 2-bit input value (i.e., 00, 01, 10, and 11 in binary notation) is translated to a 6-bit target value, which corresponds to one of the 64 discrete resistance states.

In accordance with aspects of the invention, each of the four input value 00, 01, 10, and 11 is mapped to a value at the midpoint of a corresponding range of the resistance states. In embodiments, these four ranges are 000000-001111 (i.e., 0-15 in decimal notation), 010000-011111 (i.e., 16-31 in decimal notation), 100000-101111 (i.e., 32-47 in decimal notation), and 110000-111111 (i.e., 48-63 in decimal notation). The midpoint of each range is 001000 (i.e., 8 in decimal notation), 011000 (i.e., 24 in decimal notation), 101000 (i.e., 40 in decimal notation), and 111000 (i.e., 56 in decimal notation), respectively. That is, 00 is mapped to 001000; 01 is mapped to 011000); 10 is mapped to 101000; and 11 can be mapped to 111000. Doing so provides a 16-bit margin for errors around each of the four target values.

In accordance with aspects of the invention, the most significant bits of each range are the same as the input value. For the input value of 00, the two most significant bits are in the range 000000-001111 are 00. For the input value of 01, the two most significant bits in the range 010000-011111 are 01. For the input value of 10, the two most significant bits in the range 100000-101111 are 10. For the input value of 11, the two most significant bits in the range 110000-111111 are 11. Thus, there is a direct correspondence between a 2-bit input value and the two most significant bits of the ranges of resistance states. As such, translation from a resistance range to a 2-bit value can be performed by determining the two most significant bits.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
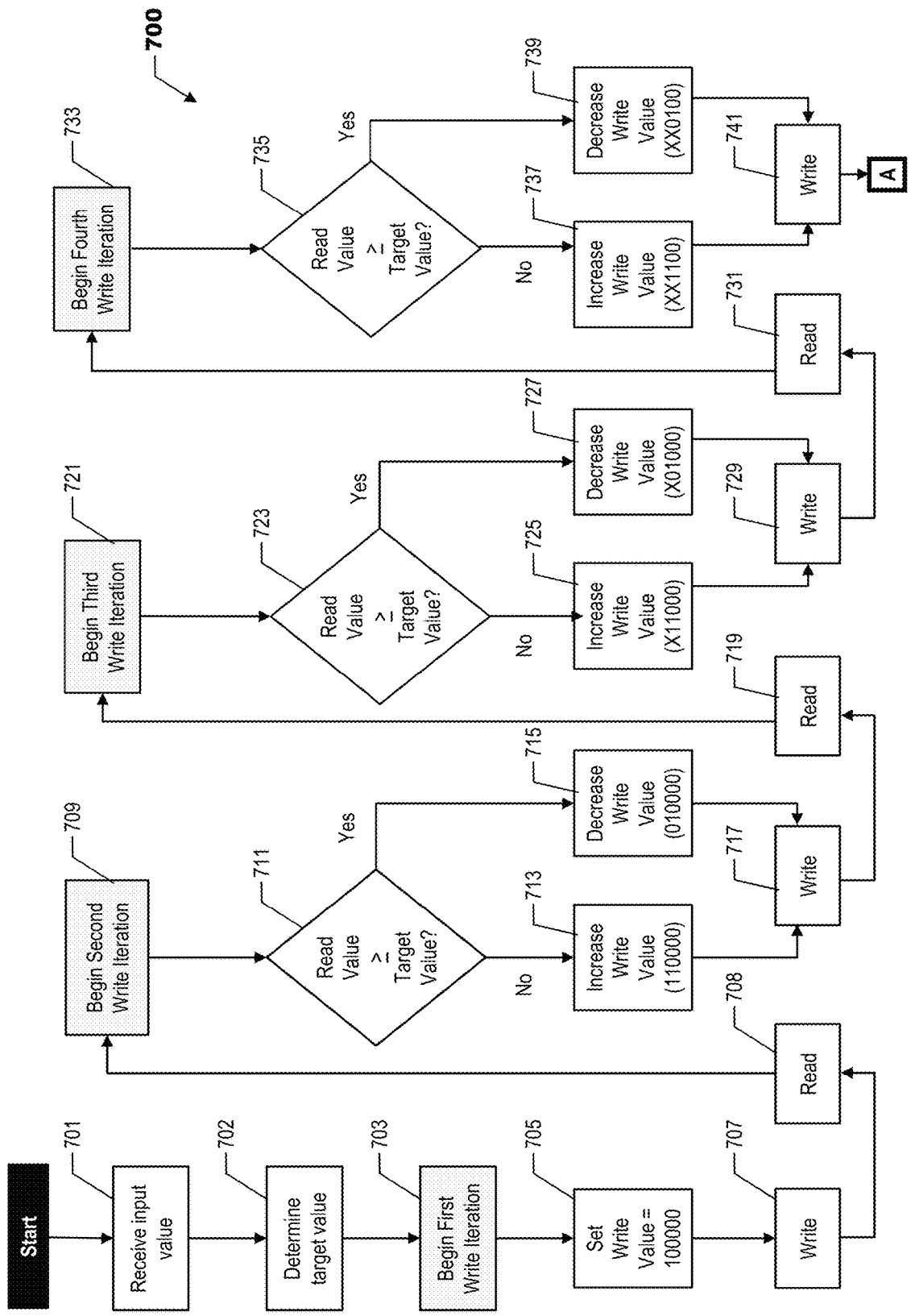
FIGS. 7 and 8 show an exemplary process flow for storing an input value in a multi-bit PCM in accordance with aspects of the invention.
Figure 8:
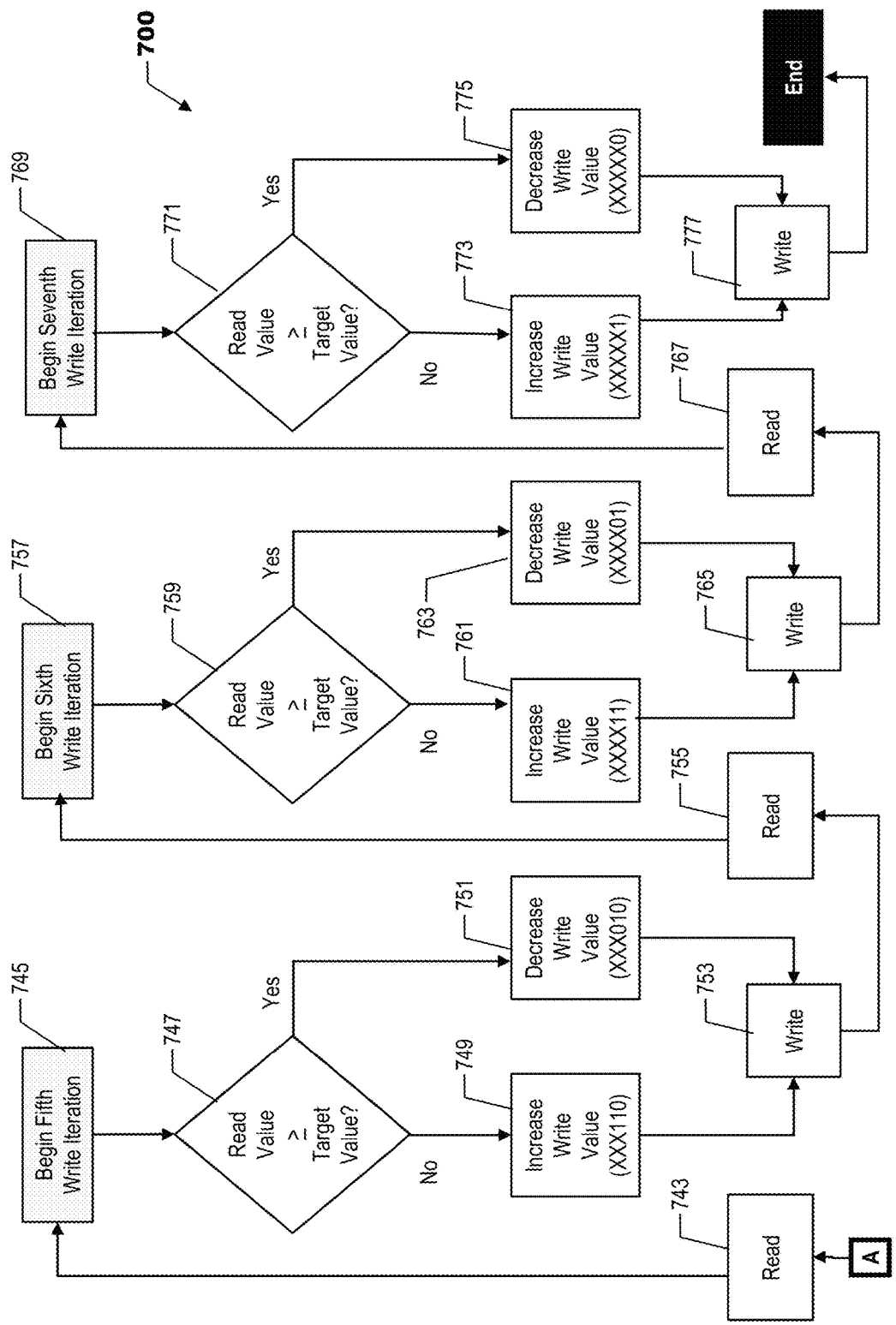

FIGS. 7 and 8 show an exemplary process flow 700 for performing aspects of the present invention. The steps of FIGS. 7 and 8 can be implemented in the system shown in FIG. 5.

The flowchart in FIGS. 7 and 8 illustrate the architecture, functionality, and operation of possible implementations of systems, methods, and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIGS. 7 and 8 show an exemplary process flow 700 for storing an input value in a storage cell (e.g., storage cell 105) in accordance with aspects of the invention. The process is performed in a sequence of iterative write and read operations that each progressively adjust an initial value stored in the storage cell through a number of intermediate values to arrive at a target value selected for the cell. In the example shown in FIGS. 7 and 8, the process includes seven iterations, which include seven write operations and six read operations, wherein the last iteration is solely a write operation.

In accordance with aspects of the invention, the first iteration writes a predetermined write value (e.g., 32 in decimal notation) to the midpoint of the resistance range of the storage cell. Doing so places a first value in the center of the entire resistance range of the PCM cell storage cell (e.g., storage cell 105) to precondition the storage cell. The subsequent write iterations iteratively adjust the initial write value though a number of intermediate values to the target value. That is, the subsequent, read operations determine if the resulting value read from the storage cell is lower than a target value (i.e., the 6-bit value determined from the 2-bit input value). In accordance with aspects of the invention, no comparison is made to see if the stored value is "close enough" to the target value. In other words, there is no determination of whether the stored value is within a predetermined range of the target value. Thus, in embodiments of the present invention, no verification step is necessary. However, in some embodiments, such a verification step can be included in the process.

Additionally, in accordance with aspects of the invention, after the first write iteration, each of the subsequent write iterations correspond to a respective one of the bits in the write value. In embodiments, each write iteration after the first determines the respective one of the plurality of bits. For example, for a 6-bit target value, a write process can include seven iterations, wherein the first iteration writes an initial, predetermined value and the six subsequent iterations set a respective bit of the target value by iteratively modifying the initial value. The modification can be performed in a bit-wise order from the most significant bit to the least significant bit. That is, the second pass determines the most significant bit (i.e., bit 5); the third pass determines the next most significant bit (i.e., bit 4); the fourth pass determines the next most significant bit (i.e., bit 3); the fifth pass determines the next most significant bit (i.e., bit 2); the sixth pass determines the next most significant bit (i.e., bit 1); and the seventh pass determines the least significant bit (i.e., bit 0).

Referring back to FIG. 7, at step 701 a multi-bit PCM circuit (e.g., system 500) receives input value (e.g., 10 in binary notation) via input/output pins (e.g., input/output pins 503). At step 702, the circuit translates the input value to a target value to be stored in a storage cell based on the input value (e.g., in the manner described with respect to FIGS. 5 and 6). In embodiments, the input value is a 2-bit number and the multi-bit PCM circuit (e.g., using write controller 505) pads the input value with predefined bits to form a 6-bit value. For example, the pad value may be 1000 in binary, such that the input values 00, 01, 10, and 11 are translated to write values of 001000, 011000, 101000, and 111000, respectively.

At step 703, the circuit begins a first write iteration 703, which may be triggered by a write enable signal (e.g., write enable signal 339) from a memory controller. At step 705, the circuit sets the write value corresponding to the middle of the resistance range of the storage cell. In embodiments, the resistance range is 000000 to 111111 (i.e. 0 to 63 in decimal notation) and, as such, the middle of storage range is 100000 (i.e., 32 in decimal notation).

At step 707, the circuit (e.g., using write head 300) writes the target value of 100000 to the storage cell (e.g., in the manner described with respect to FIGS. 3 and 4). At step 708, the circuit (e.g., using read head 100) reads the stored value in the storage cell that resulted from the write operation of the first write iteration at step 707 (e.g., in the manner described with respect to FIGS. 1 and 2). Due to physical and operational variations among storage cells, the read value may not be equal to the write value. For example, the read value in this example may be 100101 compared to the write value of 100000.

At step 709, the circuit begins a second write iteration, which may be triggered by an end of the first write operation. The second write iteration modifies the write value from step 705 based on the read value from step 707 and the target value from step 702. More specifically, at step 711, the circuit (e.g., using the write head controller 505) determines whether the read value from step 708 (e.g., 100101) is greater than or equal to the target value from step 702 (i.e., 101000). In embodiments, the comparison uses only the three most significant bits of the read value and pads them with zeros to provide a 6-bit value for comparison. That is, the circuit can determine whether the three most significant bits of read value (e.g., 100101) is greater than or equal to the target value (i.e., 101000).

At step 713, if the circuit determines in step 711 that the read value is not greater than or equal to the target value, then the circuit increases the write value from step 707. In embodiments, the two most significant bits of the value from step 707 are incremented. For example, the write word from step 707 can be set to 110000. Otherwise at step 715, if the circuit determines in step 711 that the read value is greater than or equal to the target value, then the circuit decreases the write value from step 707. In embodiments, the two most significant bits of the value from step 707 are decremented. For example, the write word from step 707 can be set to 010000.

At step 717, the circuit writes the write value determined at step 713 or step 715 to the storage cell. At step 719, the circuit reads the value written in the storage cell at step 717. At step 721, the circuit begins a third write iteration. The third write iteration modifies the write value from step 717 based on the read value from step 719 and the target value from step 702. More specifically, at step 723, the circuit determines whether the read value is greater than or equal to the target value. In embodiments, the comparison uses only the three most significant bits of the read value and pads them with zeros to provide a 6-bit value for comparison. For example, assuming the process followed the path including step 713, the read value can be 110101. Accordingly, at step 723, it can be determined whether the three most significant bits of the read value (e.g., 110101) are greater than the three most significant bits of the target value (e.g., 101000).

At step 725, if the circuit determines in step 723 that the read value from step 719 is not greater than or equal to the target value, then the circuit increases the write value from step 717. In embodiments, the next two most significant bits of the value from step 717 are incremented. For example, the write value from step 717 can be set to X11000 (wherein X corresponds to the respective bit of the write value from step 717). Otherwise at step 727, if the circuit determines in step 723 that the read value from step 719 is greater than or equal to the target value, then the circuit decreases the write value from step 717. In embodiments, the next two most significant bits of the value from step 717 are decremented. For example, the write value from step 717 can be set to X01000 (wherein X corresponds to the respective bit of the write value from step 717).

At step 729, the circuit writes the write value determined at step 725 or step 727 to the storage cell. At step 731, the circuit reads the value written in the storage cell at step 729. At step 735, the circuit begins a fourth write iteration. The fourth write iteration modifies the write value at step 729 based on the read value from step 731 and the target value from step 702. More specifically, at step 735, the circuit determines whether the read value is greater than or equal to the target value. In embodiments, the comparison uses only the three most significant bits of the read value and pads them with zeros to provide a 6-bit value for comparison. For example, assuming the process followed the path including step 727, the read value can be 101101. Accordingly, at step 735, it can be determined whether the three most significant bits of the read value (e.g. 101101) are greater than the three most significant bits of the target value (e.g., 101000).

At step 737, if the circuit determines that the read value from step 731 is not greater than or equal to the target value, then the circuit increases the write value from step 729. In embodiments, the next two most significant bits of the value from step 729 are incremented. For example, the write value from step 729 can be set to XX1000 (wherein XX correspond to the respective bits of the write value from step 729). Otherwise at step 739, if the circuit determines in step 735 that the read value from step 731 is greater than or equal to the target value, then the circuit decreases the write value from step 729. In embodiments, the next two most significant bits of the value from step 729 are decremented. For example, the write value from step 729 can be set to XX0100 (wherein XX correspond to the respective bits of the write value from step 729).

At step 741, the circuit writes the write value determined at step 737 or step 739 to the storage cell. FIG. 8 continues the process 700 shown in from point A. At step 743, the circuit reads the value written in the storage cell at step 741. At step 745, the circuit begins a fifth write iteration. The fifth write iteration modifies the write value from step 741 based on the read value from step 743 and the target value from step 702. More specifically, at step 747, the circuit determines whether the read value from step 743 is greater than or equal to the target value (e.g., 101000). In embodiments, the comparison uses only the three most significant bits of the read value and pads them with zeros to provide a 6-bit value for comparison. For example, assuming the process followed the path including step 739, the read value can be 100111. Accordingly, at step 747, it can be determined whether the three most significant bits of the read value (e.g. 101000) are greater than the three most significant bits of the target value (e.g., 101000).

At step 749, if the circuit determines that the read value from step 743 is not greater than or equal to the target value from step 702, then the circuit increases the write value from step 741. In embodiments, the next two most significant bits of the value from step 741 are incremented. For example, the write value from step 741 can be set to XXX110 (wherein XXX correspond to the respective bits of the write value from step 741). Otherwise at step 751, if the circuit determines in step 747 that the read value from step 743 is greater than or equal to the target value from step 702, then the circuit decreases the write value from step 741. In embodiments, the next two most significant bits of the value from step 741 are decremented. For example, the write value from step 741 can be set to XXX010 (wherein XXX correspond to the respective bits of the write value from step 741).

At step 753, the circuit writes the write value determined at step 749 or step 751 to the storage cell. At step 755, the circuit reads the value written in the storage cell at step 753. At step 757, the circuit begins a sixth write iteration. The sixth write iteration modifies the write value from step 753 based on the read value from step 755 and the target value from step 702. More specifically, at step 759, the circuit determines whether the read value is greater than or equal to the target value (i.e., 101000). In embodiments, the comparison uses only the three most significant bits of the read value and pads them with zeros for comparison. For example, assuming the process followed the path including step 749, the read value can be 100111. Accordingly, at step 759, it can be determined whether the three most significant bits of the read value (e.g. 100111) are greater than the three most significant bits of the target value (e.g., 101000).

At step 761, if the circuit determines that the read value from step 755 is not greater than or equal to the target value from step 702, then the circuit increases the write value from step 753. In embodiments, the next two most significant bits of the value from step 753 are incremented. For example, the write value from step 753 can be set to XXXX11 (wherein XXXX correspond to the respective bits of the write value from step 753). Otherwise at step 763, if the circuit determines that the read value from step 755 is greater than or equal to the target value from step 702, then the circuit decreases the write value from step 753. In embodiments, the next two most significant bits of the value from step 753 are decremented. For example, the write value from step 753 can be set to XXXX01 (wherein XXXX correspond to the respective bits of the write value from step 753).

At step 765, the circuit writes the write value determined at step 761 or step 763 to the storage cell. At step 767, the circuit reads the value written in the storage cell at step 765. At step 769, the circuit begins a seventh write iteration. Notably, in embodiments of the invention, the final write iteration does not include a corresponding read iteration. The seventh write iteration modifies the write value at step 765 based on the read value from step 767 and the target value from step 702. More specifically, at step 771, the circuit determines whether the read value is greater than or equal to the target value (i.e., 101000). In embodiments, the comparison uses only the three most significant bits of the read value and pads them with zeros for comparison. For example, assuming the process followed the path including step 761, the read value can be 101000. Accordingly, at step 771, it can be determined whether the three most significant bits of the read value (e.g. 101000) are equal to the three most significant bits of the target value (e.g., 101000).

At step 773, if the circuit determines that the read value from step 767 is not greater than or equal to the target value from step 702, then the circuit increases the write value from step 765. In embodiments, the least significant bit of the value from step 765 is incremented. For example, the write value from step 765 can be set to XXXXX1 (wherein XXXXX correspond to the respective bits of the write value from step 765). Otherwise at step 775, if the circuit determines that the read value from step 767 is greater than or equal to the target value from step 702, then the circuit decreases the write value from step 765. In embodiments, the least significant bit of the value from step 765 is decremented. For example, the write value from step 765 can be set to XXXXXO (wherein XXXXX correspond to the respective bits of the write value from step 765). At step 777, the circuit writes the write value determined at step 773 or step 775 to the storage cell. After step 777, the process 700 ends.

In the process 700, the input value of 10 (i.e., 2 in decimal notation) is used to generate the target value 101000 (i.e., 40 in decimal notation). In accordance with aspects of the invention, a number of iterations are used to write the target value to accommodate variations in different storage cells. That is, in the initial iteration (i.e., the first write iteration 703) the write value is always the same value that is selected to be the middle of the resistance range of the storage cell (e.g., 32 of 64 resistance states). Subsequent iterations tune the initial write value such that the value written in the final iteration (i.e., the seventh iteration 769) will result in a value stored in the cell that, when subsequently read, will result in a read value that is the same or substantially the same as the target value. Accordingly, the circuit reliably outputs the input value.

In the example shown in FIGS. 7 and 8, process 700 includes seven iterations, which include seven write operations and six read operations to store a two-bit input value. Embodiments of the invention may use other numbers of iterations to store different numbers of bits. Further, in embodiments, "direct writing" of values can be used in combination with process 700. For example, embodiments can use a single write step (e.g. step 707) to write the lowest input value (i.e., 00) and the highest input value (i.e., 11) without multiple iterations. In other words, the input value 00 can be written in a single write step (e.g., step 707) to the lowest possible target value of 000000. Similarly, the input value 11 bit can be written in a single write step to the highest possible target value of 1111111. Input values other than 00 or 11 would still be written using process 700. By performing such a "direct write" of the 00 and 11 inputs, embodiments of the invention would decrease the total write time.

Figure 9:
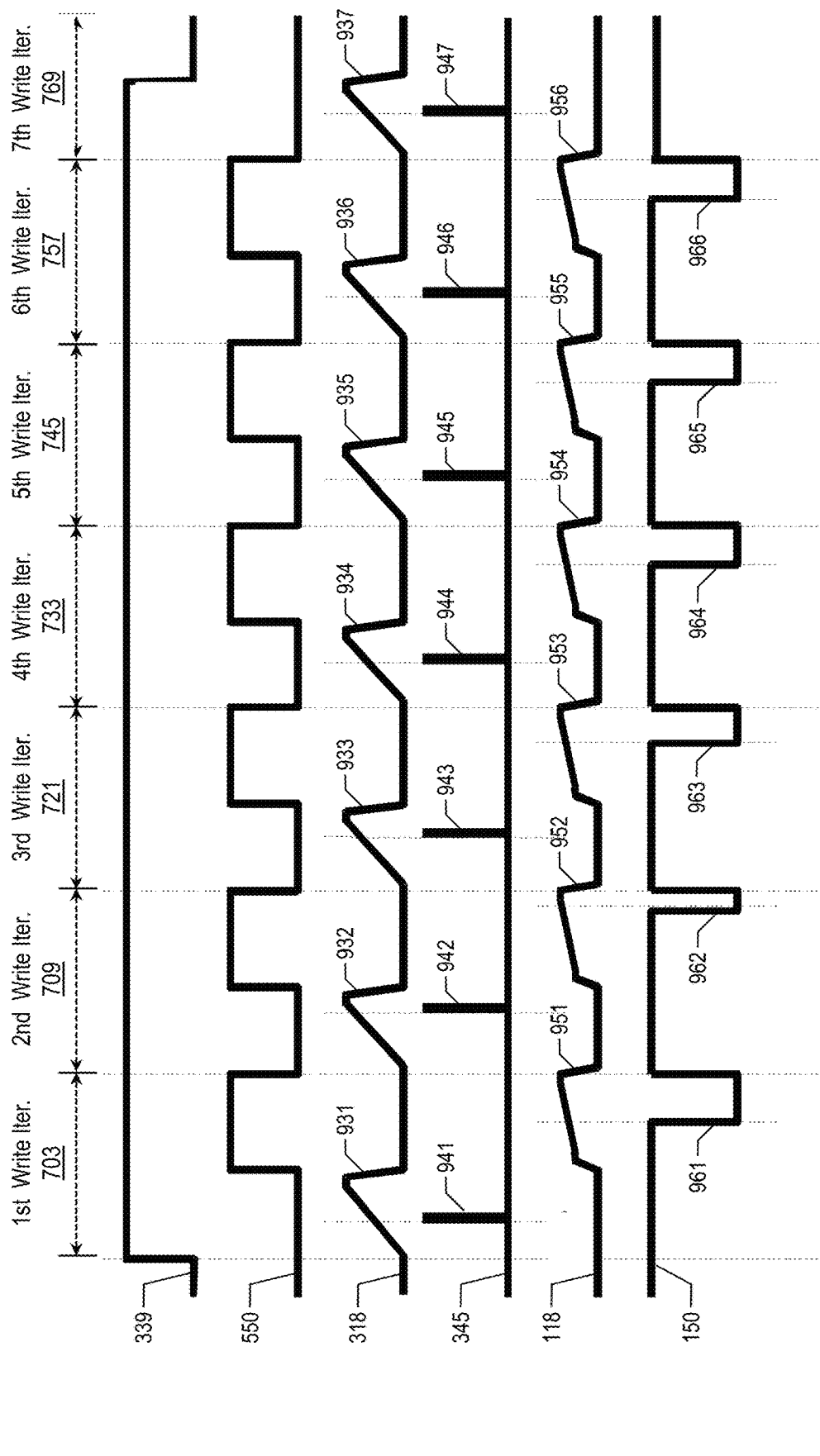
FIG. 9 illustrates a write process by an exemplary system in accordance with aspects of the invention.

FIG. 9 illustrates a write process (e.g., process 700) by an exemplary system (e.g., system 500) in accordance with aspects of the invention. FIG. 9 shows a relationship between timing of signals in an exemplary write process (e.g., process 700). The signals includes the write enable signal 339, the read enable signal 550, write-reference voltage 318, write signal 345, read reference signal 118, and output signal 150. The write enable signal 339 is a control logic signal received from, for example, a memory controller that activates the write process. In embodiments, the write process includes seven write iterations (e.g., steps 703, 709, 721, 733, 745, 757, and 769). The write enable signal 339 in a high logic state throughout the write process, including each write iteration.

The read enable signal 550 is a control logic signal generated by the system (e.g., read head 100) that activates read operations. For example, where the write process includes seven write iterations, including six read operations (e.g., steps 708, 719, 731, 743, 755, and 767), the system can set the read signal 550 to a logic high state to trigger the read operations between each of the write operations (e.g., steps 707, 717, 729, 741, 753, 765, and 777). As shown in FIG. 9, the read signal 550 is placed in high logic state to start the read operations after completion of the write operations.

The write-reference voltage 318 is a time-varying signal that ramps (e.g. increases) during the period of each write iteration to provide current that is used to write values to a storage cell (e.g., storage cell 105). For example, in an exemplary write operation (e.g., process flow 700) including seven write iterations, there are seven write ramps 931 . . . 937 of the write signal corresponding to each write operation (e.g., steps 707, 717, 729, 741, 753, 765, and 777). Each of the write ramps 931 . . . 937 increase a current that can be driven into the storage cell.

The write signal 345 is a control logic signal determined by the system that triggers the writing of a value to the storage cell at a particular time corresponding to a value of the write-reference voltage 318. For example, when the write-reference voltage 318 ramps up (e.g., from 0 to 63) over time (e.g., time increments 0-63), the write signal pulses (e.g., from a low logic state to a high logic state) at a time (e.g., time increment 32) to program a corresponding resistance state of the storage cell, which represents information (e.g., 32). In accordance with aspects of the invention, each of the write operations (e.g., steps 707, 717, 729, 741, 753, 765, and 777) generates a pulse 941 . . . 947 at a particular time during a corresponding write ramp 931 . . . 937 such that the current voltage of the write ramps 931 . . . 937 drives current into the storage cell to change the resistive state of the storage cell.

The read-reference voltage 118 is a time-varying signal that increases (i.e., ramps) over time to provide current used to read values from the storage cell. In embodiments, there are six read ramps 951 . . . 956 of the read control signal corresponding to each read operations (e.g., steps 708, 719, 731, 743, 755, and 767). Each increment of time and voltage (e.g., steps) of the read-reference voltage 118 corresponds to a discrete resistance state of the storage cell. For example, the read-reference voltage 118 can increase in 64 steps that correspond to 64 discrete resistance states of the storage cell.

The read output signal 150 is a logic signal that indicates the value of the storage cell during a read operation (e.g., steps 708, 719, 731, 743, 755, and 767). The read output signal 150 change logic states (e.g., from a high logic state to a low logic state) at the time when the ramped voltage of the read reference signal 118 is the same as the voltage across the storage cell. As such, the time the read output signal 150 changes state indicates the value stored in the storage cell. For example, in FIG. 9, the read output signal changes states at 961 . . . 966.

FIGS. 10-22 illustrate an exemplary write process (e.g., process 700) for a multi-bit PCM system (e.g., system 500) in accordance with aspects of the invention. In the present example, the system stores 2-bits of information representing the binary value 10, which is stored in a single storage cell of the multi-bit PCM. These 2-bits may be part of a larger binary value that is stored in using several storage cells of the multi-bit PCM. For example, an 8-bit word can be stored in four storage cells.

In accordance with aspects of the invention, the received input value is translated to a value that corresponds to a resistance state of the storage cell (e.g., using the process of FIG. 6). In the preset example, the storage cell can assume any of 64 resistance states (e.g. 0-63 in decimal, or 000000-111111 in binary). Accordingly, the received 2-bit value is translated to a 6-bit value that corresponds to one of the 64 resistance state. As the present example stores input in four portions of the 64 resistance states to leave margin for error, the circuit can pad the 2-bit input value with predefined bits to form a 6-bit value. That is, the pad value may be 1000 in binary, such that the input values 10 is translated to a target values of 101000 (i.e., 40), which correspond to one of the resistive states of the storage cell.

In accordance with aspects of the invention, the system sets the target value of 101000 using seven iterations, wherein a first operation stores an initial write value at the center of resistance range of the storage cell. Since there are 64 resistance states having values ranging from 0-63 (i.e., 000000 to 111111 in binary notation) in this example, the center of the resistance range is 32 (i.e., 100000 in binary notation). Subsequent write operations progressively modify (e.g., tune) this initial write value 100000 such that it is the same or substantially the same as the target value of 101000.

Figure 10:
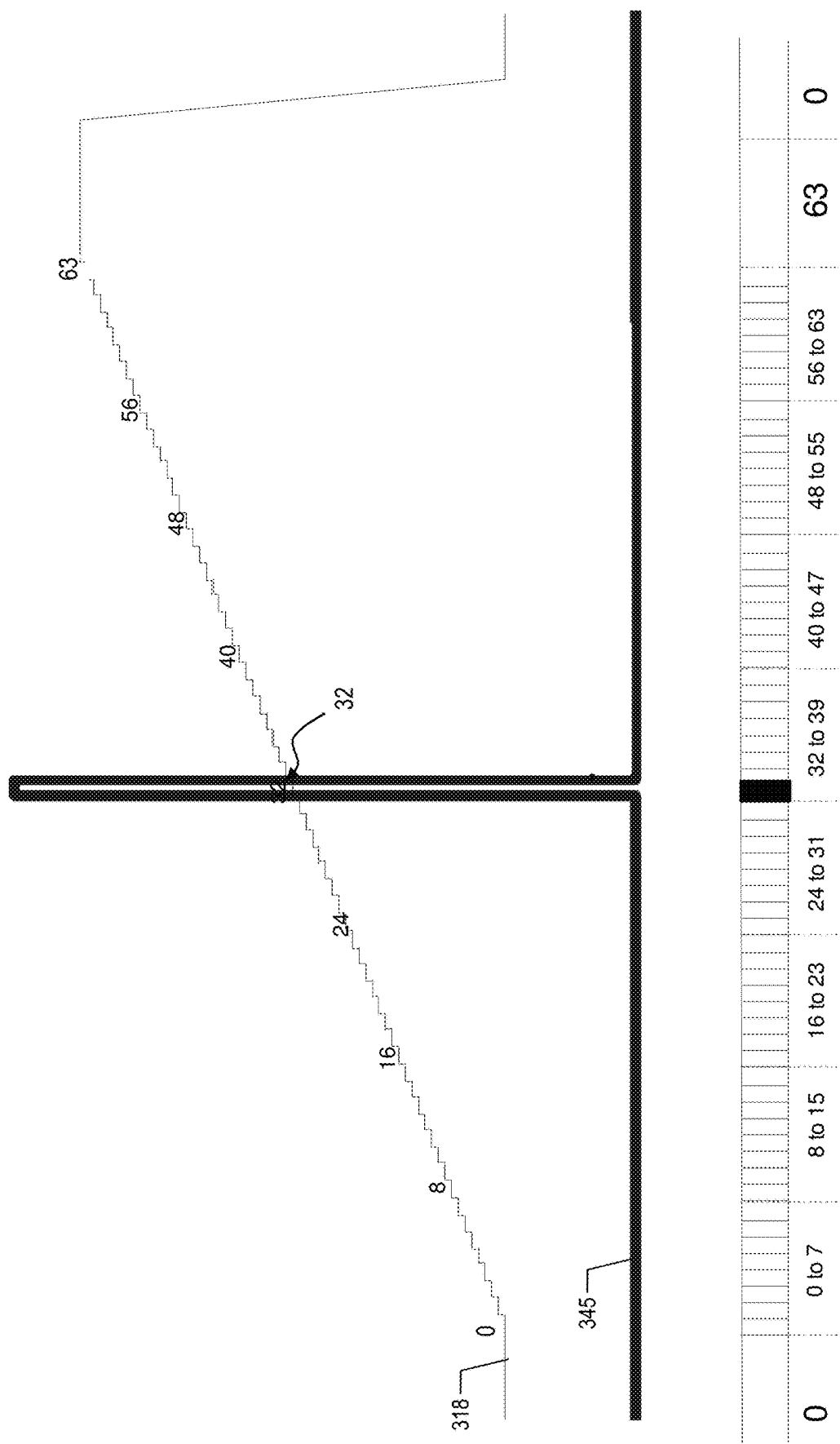
FIGS. 10-22 illustrate steps of an exemplary write process in accordance with aspects of the invention.
Figure 11:
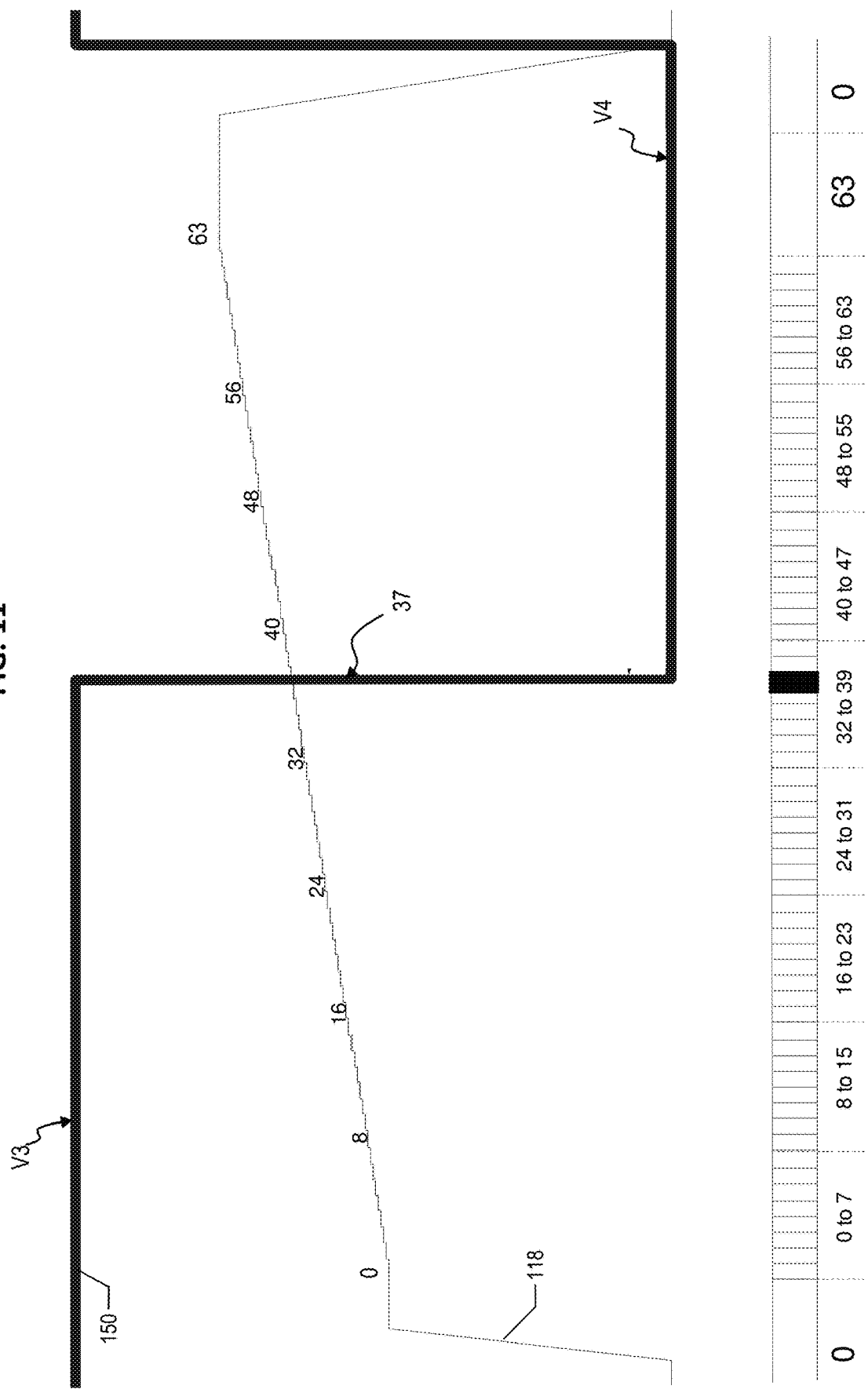

FIGS. 10 and 11 illustrate a first write iteration (e.g., step 703). Referring to FIG. 10, the system stores the initial value to 100000 (e.g., step 705), which is at the center of the resistance range of the storage cell. Accordingly, in a first write operation (e.g., step 707), the system triggers the write signal 345 such that it pulses at 32nd time increment when a ramped write-reference voltage 318 is at a 32nd step (i.e. step 100000) that corresponds to the a 32nd resistance state of the storage cell.

FIG. 11 shows a first read operation (e.g., step 708) of the exemplary write process. As shown the read-reference signal 118 is ramped from an initial voltage step 0 to a final voltage step 63. The ramping of the read reference signal 118 can be triggered by a read enable signal (e.g., read control signal 550) at the end of the first write operation. When read-reference voltage 118 is the same as the voltage across the storage cell due to the stored value, the read output signal 150 switches logic states. In this example, the read output signal 150 switches states at step 37 of the read reference signal. Accordingly, the multi-bit PCM determines that the value of storage cell is 37 (i.e., 100101 in binary). This value may be obtained from a counter synced with the step of the read reference signal 118. The difference between the write value of 32 and the read value of 37 may be due physical and operational variations among storage cells such that the voltage of the write reference signal 318 at step 32 does not align with the corresponding resistance of the storage cell.

Figure 12:
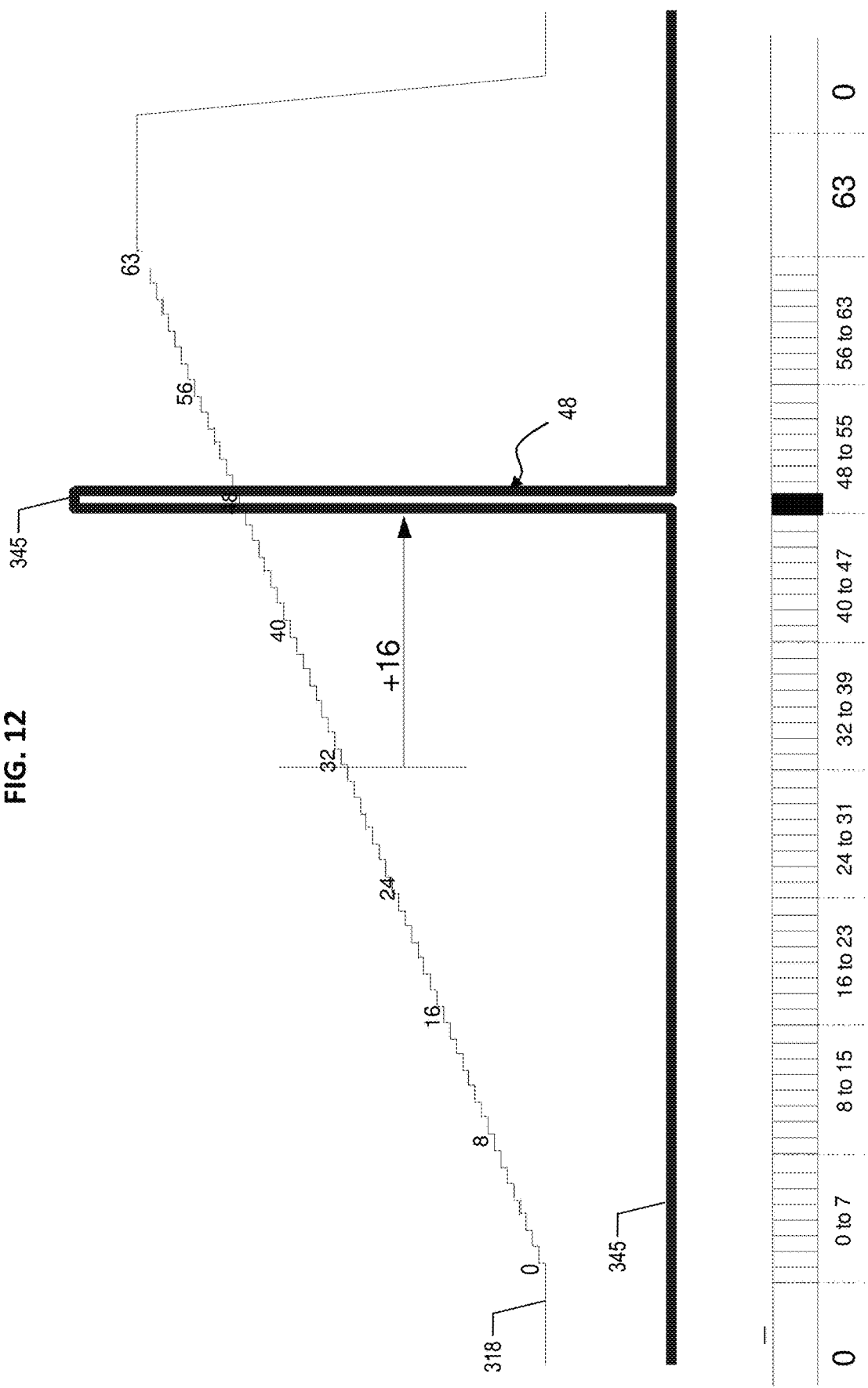
Figure 13:
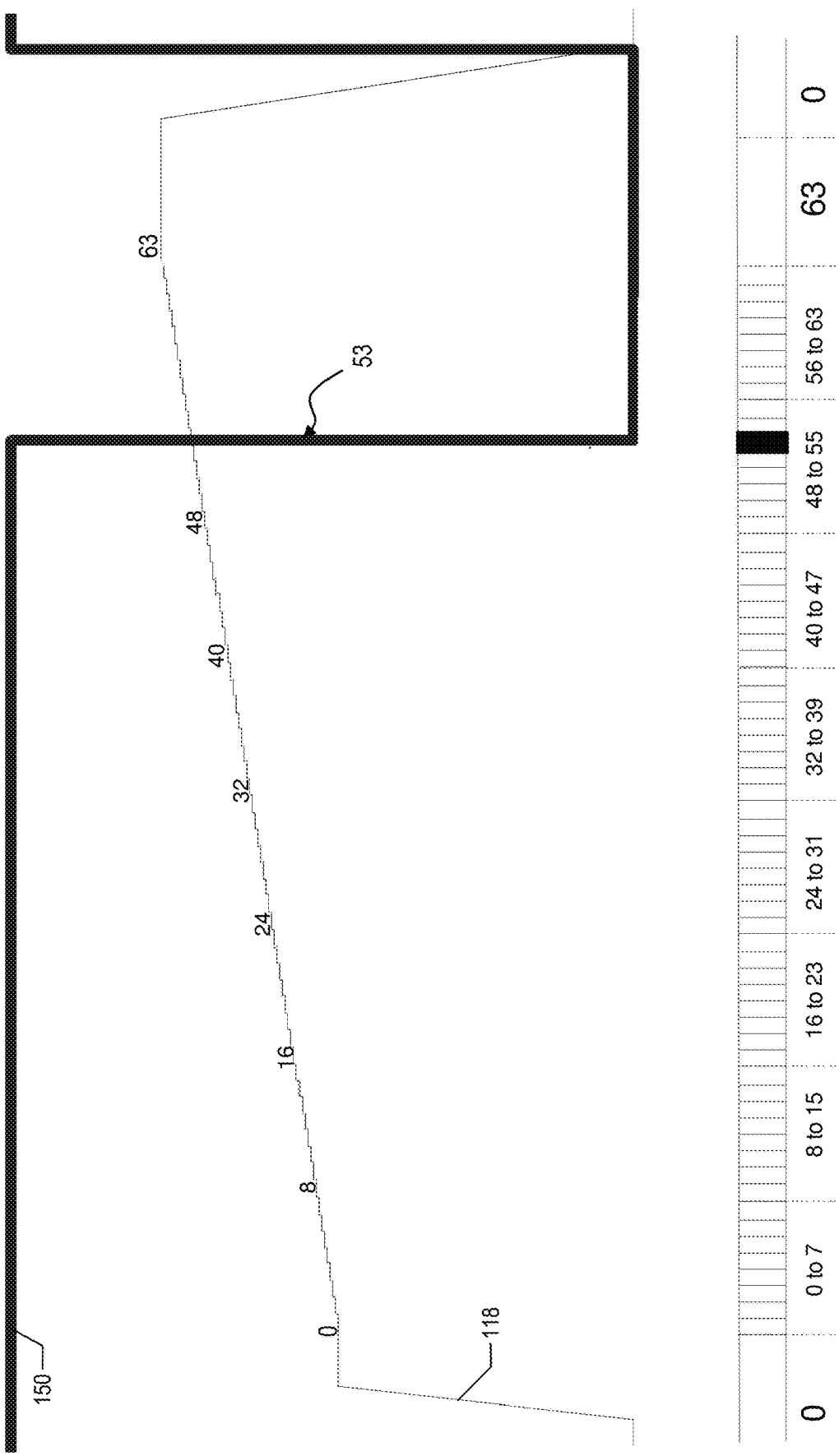

FIGS. 12 and 13 illustrate a second write iteration (e.g., step 709). Here, the system stores the write value to 48 (i.e., 110000). This write value is determined based on the difference between the read value in FIG. 11 (i.e. 100101) and the target value (i.e., 101000). That is, in accordance with aspects of the invention, the system compares the three most significant bits of the read value (i.e., 100101) with those of the target value (i.e., 101000). Since the read value is less than the target value, the system increases the write value from 100000 (i.e., 32) to 1100000 (i.e., 48) by incrementing the two-most significant bits, which increase the value by 16 (i.e., from 32 to 48).

Referring to FIG. 12, the system stores the determined write value of 48 (i.e., 110000) in the storage cell. Accordingly, in a second write operation (e.g., step 717), the system triggers the write signal 345 such that it pulses at 48th time increment (e.g., 110000) when a ramped write-reference voltage 318 is at a 48th step (i.e. step 110000) that corresponds to the a 48th resistance state of the storage cell. FIG. 13 shows a second read operation (e.g., step 719) of the exemplary write process. In this read operation, the read output signal 150 (e.g., output signal 150) switches states at step 53 of the read reference signal 118. Accordingly, the system determines that the value of storage cell is 53 (i.e., 110101 in binary).

Figure 14:
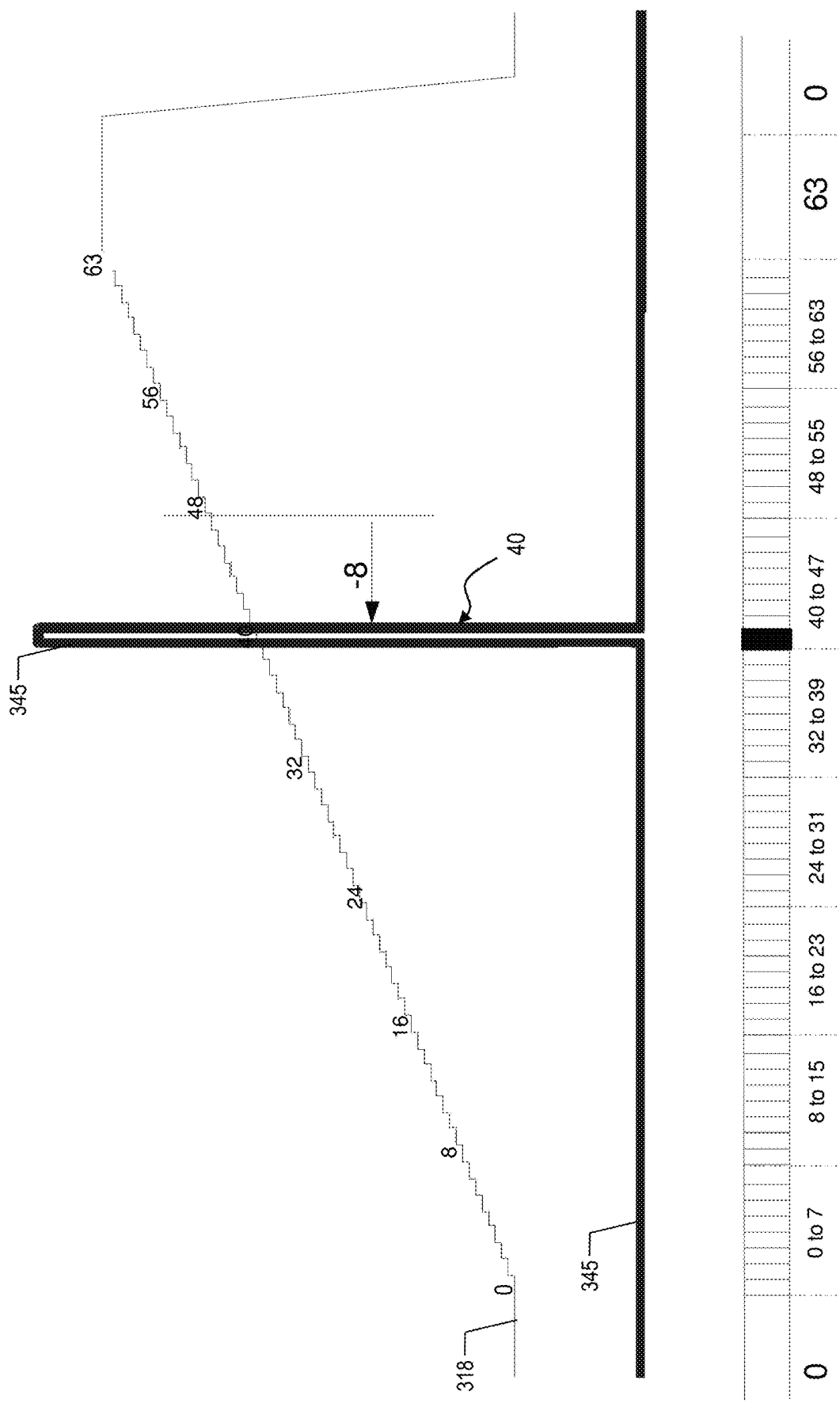
Figure 15:
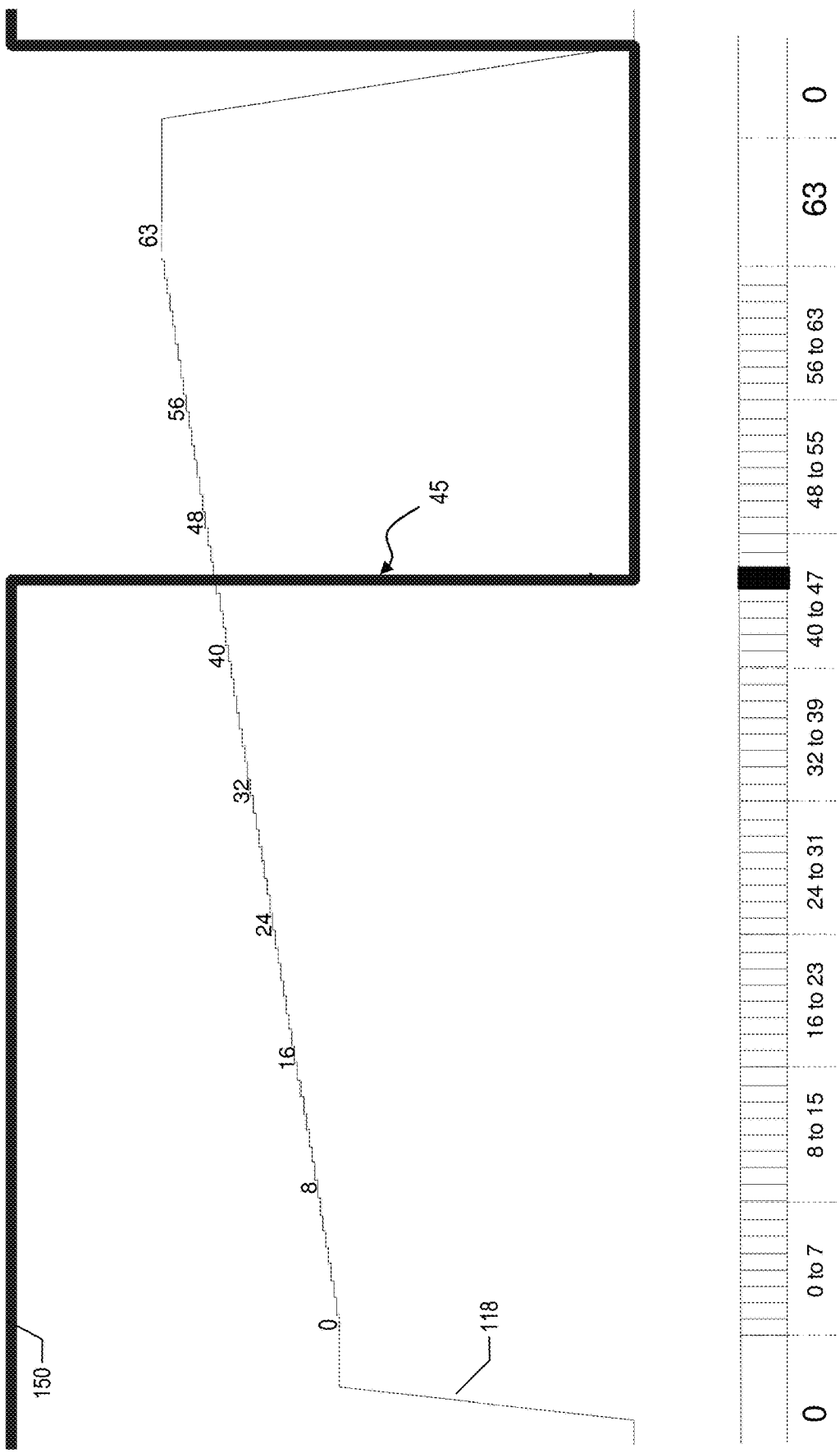

FIGS. 14 and 15 illustrate a third write iteration (e.g., step 721). In this iteration, the system sets the write value to 40 (i.e., 101000). The write value is determined based on the difference between the value 110101 read in FIG. 13 (i.e. 53) and the target value 101000 (i.e., 40). That is, since the three most significant bits of the read value (i.e., 110000) is not less than those of the target value (i.e., 101000), the system decreases the write value from 110000 (i.e., 48) to 101000 (i.e., 40) by decrementing the second and third-most significant bits, which decreased the write value by 8.

As shown in FIG. 14, the third write iteration stores the determined write value of 40 (i.e., 101000) in the storage cell. That is, the system triggers the write signal 345 such that it pulses at 40th time increment when a ramped write-reference voltage 318 is at a 40th step (i.e. step 101000) that corresponds to the a 40th resistance state of the storage cell. FIG. 15 shows a third read operation (e.g., step 731) of the exemplary write process. In this read operation, the read output signal 150 switches states at step 45 of the read reference signal 118. Accordingly, the system determines that the value of storage cell is 45 (i.e., 101101 in binary).

Figure 16:
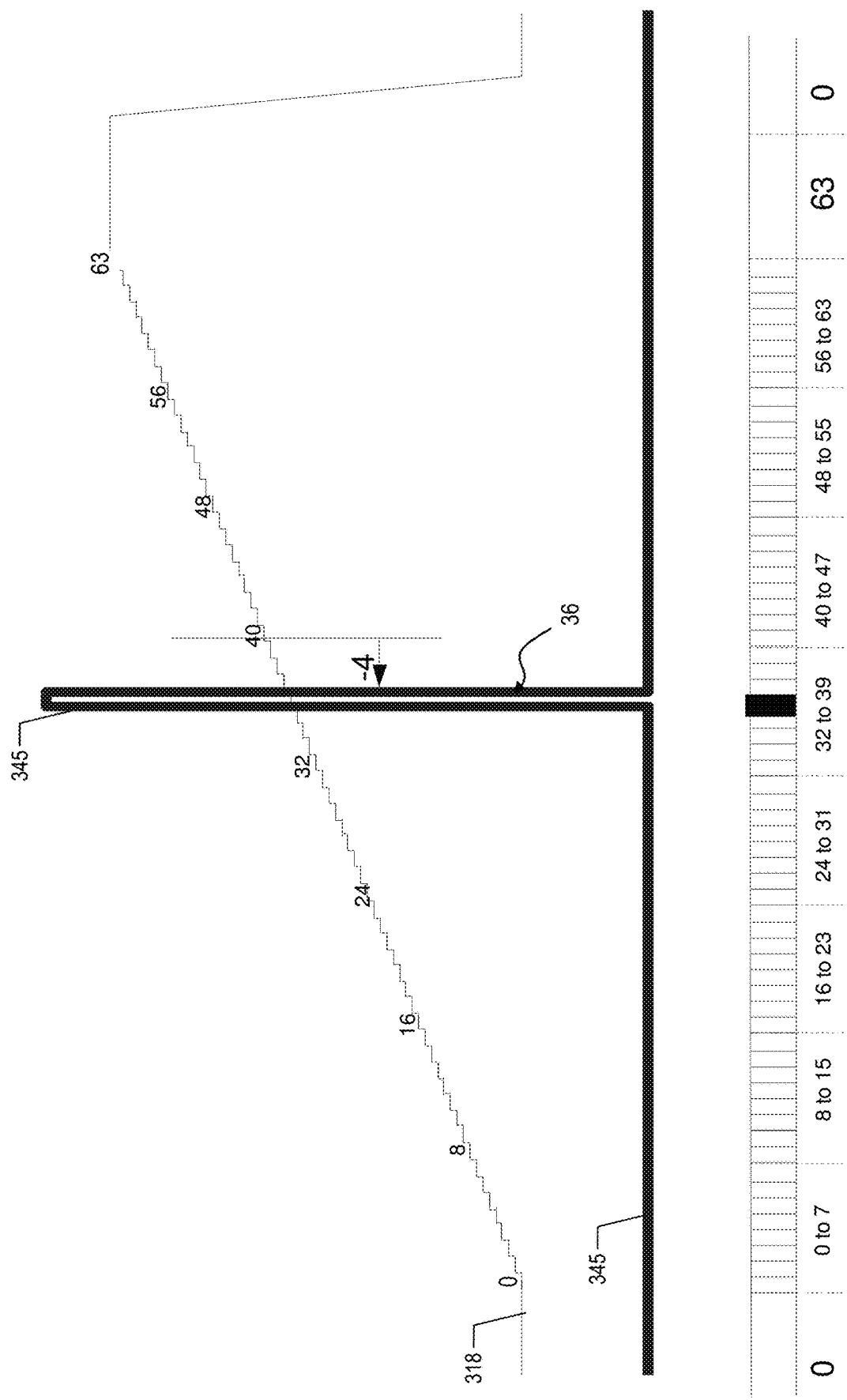
Figure 17:
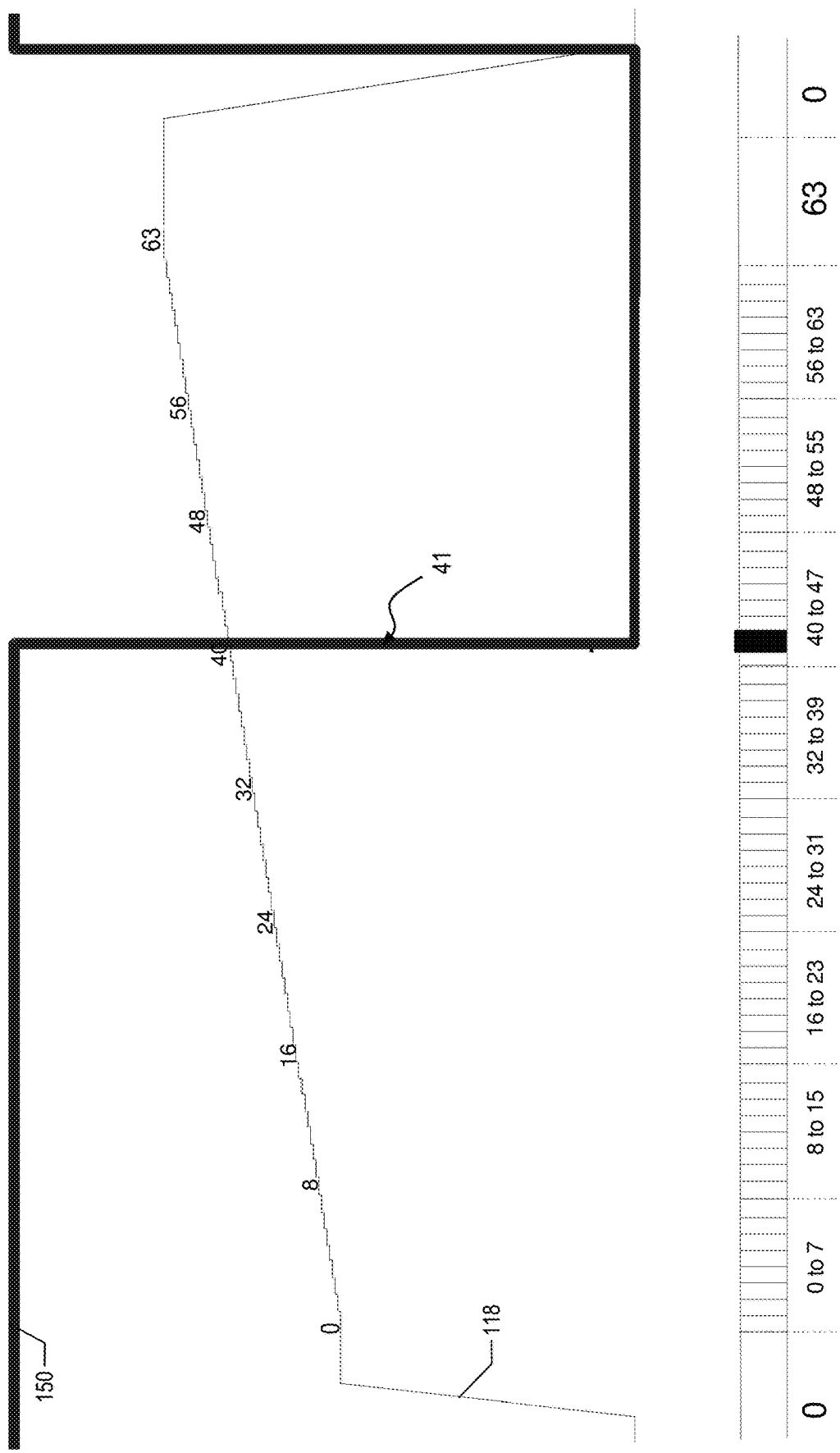

FIGS. 16 and 17 illustrate a fourth write iteration (e.g., step 733). Here, the system sets the write value to 36 (i.e., 100100), which is determined based on the difference between the value 101101 read in FIG. 15 (i.e. 45) and the target value 101000 (i.e., 40). That is, since the three most significant bits of the read value (i.e., 101101) are greater than or equal to three most significant bits of the target value (i.e., 101000), the system decreases the previous write value from 101000 (i.e., 40) to 100100 (i.e., 36) by holding the first and second most significant bits, decreasing the third most significant bit, and increasing the fourth most significant bit, which decreases the target value by 4.

As shown in FIG. 16, the fourth write iteration (e.g., step 741) stores the determined write value of 36 (i.e., 100100) in the storage cell. That is, the system triggers the write signal 345 such that it pulses at 36th time increment when a ramped write-reference voltage 318 is at a 36th step (i.e. step 100100) that corresponds to the a 36th resistance state of the storage cell. FIG. 17 shows a fourth read operation (e.g., step 743) of the exemplary write process. Here, the read output signal 150 switches states at step 41 of the read reference signal 118. Accordingly, the system determines that the value of storage cell is 41 (i.e., 101001 in binary).

Figure 18:
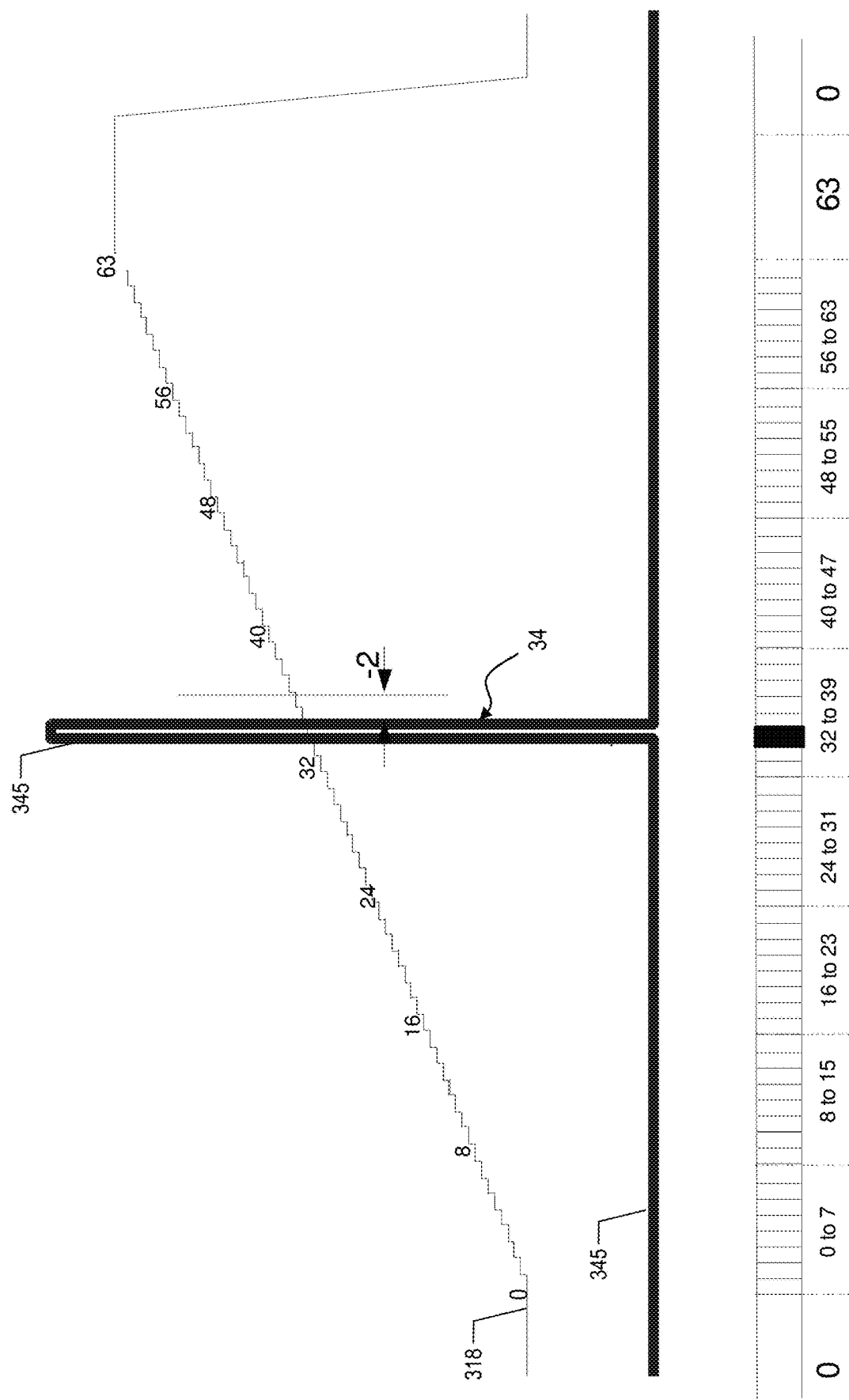
Figure 19:
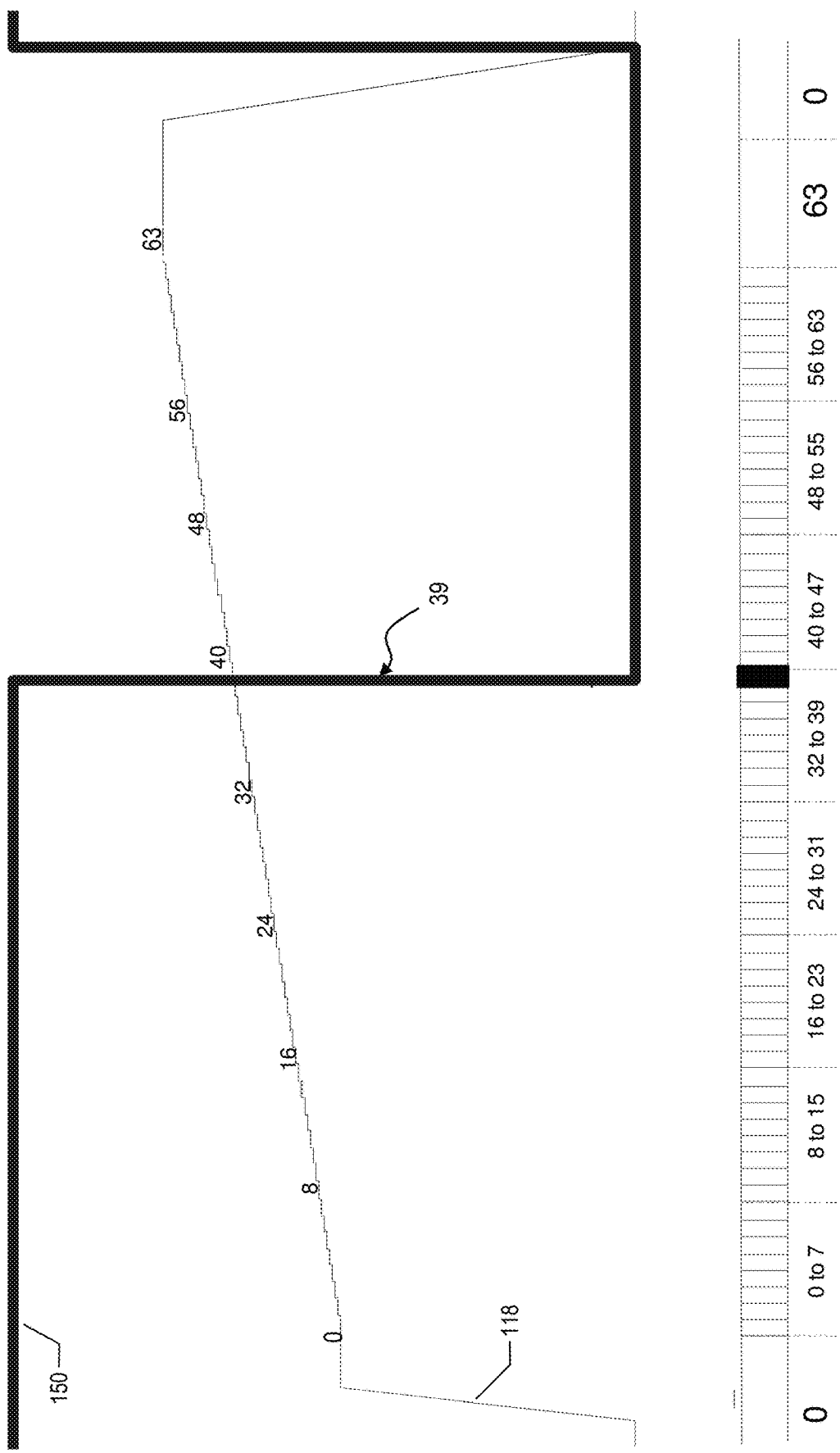

FIGS. 18 and 19 illustrate a fifth write iteration (e.g., step 745). In this case, the system sets the write value to 34 (i.e., 100010), which is determined based on the difference between the value read 101001 in FIG. 17 (i.e. 41) and the target value 101000 (i.e., 40). That is, the three most significant bits of the read value (i.e., 101001) are greater than or equal to those of the target value (i.e., 101000). Thus, the system decreases the previous write value from 100100 (i.e., 36) to 100010 (i.e., 34), which decreases the target value by 2.

FIG. 18 shows the fifth write operation (e.g., step 753), which stores the determined write value of 34 (i.e., 100100) in the storage cell. That is, the system triggers the write signal 345 such that it pulses at 34th time increment when a ramped write-reference voltage 318 is at a 34th step (i.e. step 100010) that corresponds to the a 34th resistance state of the storage cell. FIG. 19 shows a fifth read operation (e.g., step 755) of the exemplary write process. In this read operation, the read output signal 150 switches states at step 39 of the read reference signal 118. Accordingly, the system determines that the value of storage cell is 39 (i.e., 100111 in binary).

Figure 20:
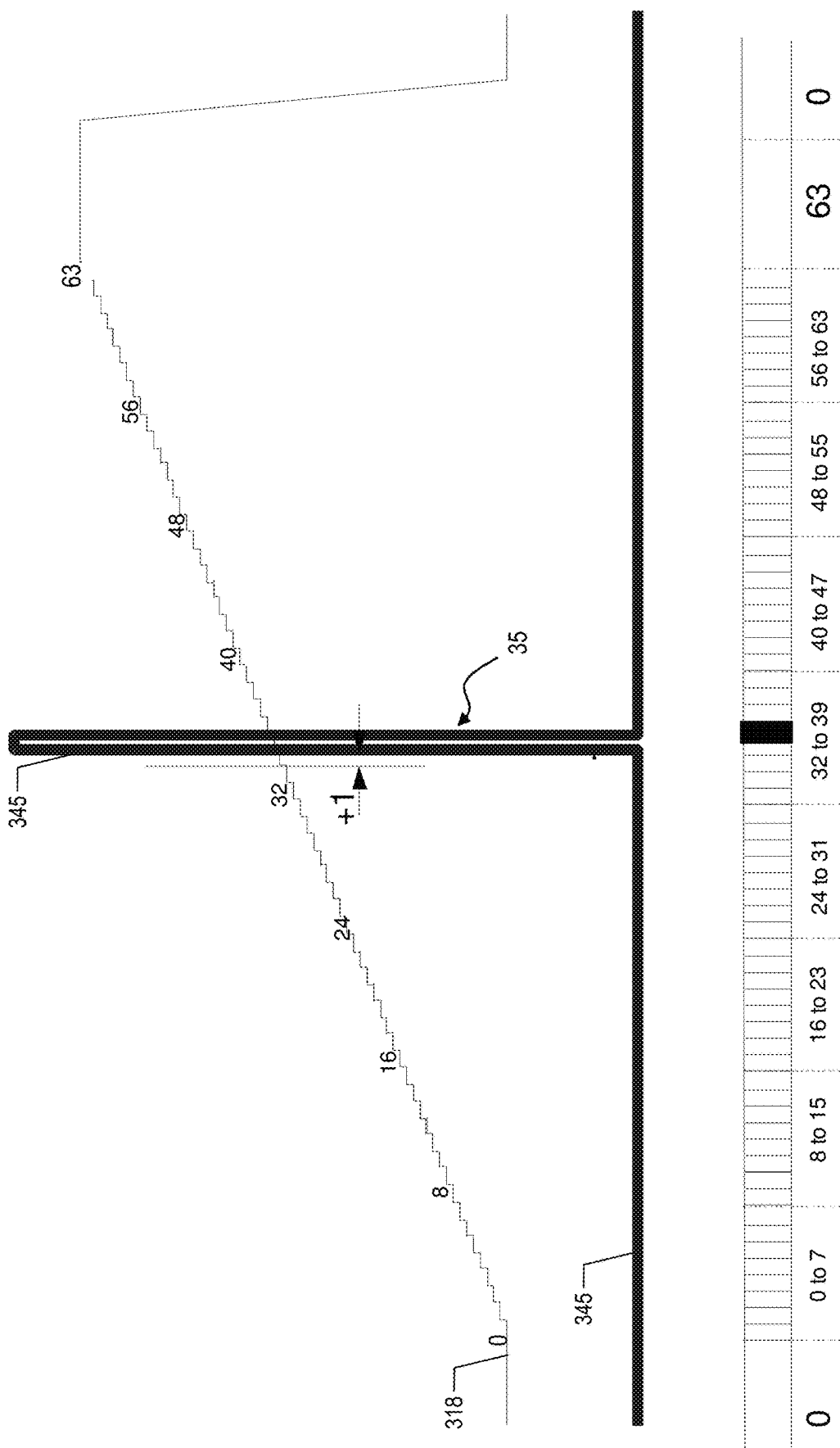
Figure 21:
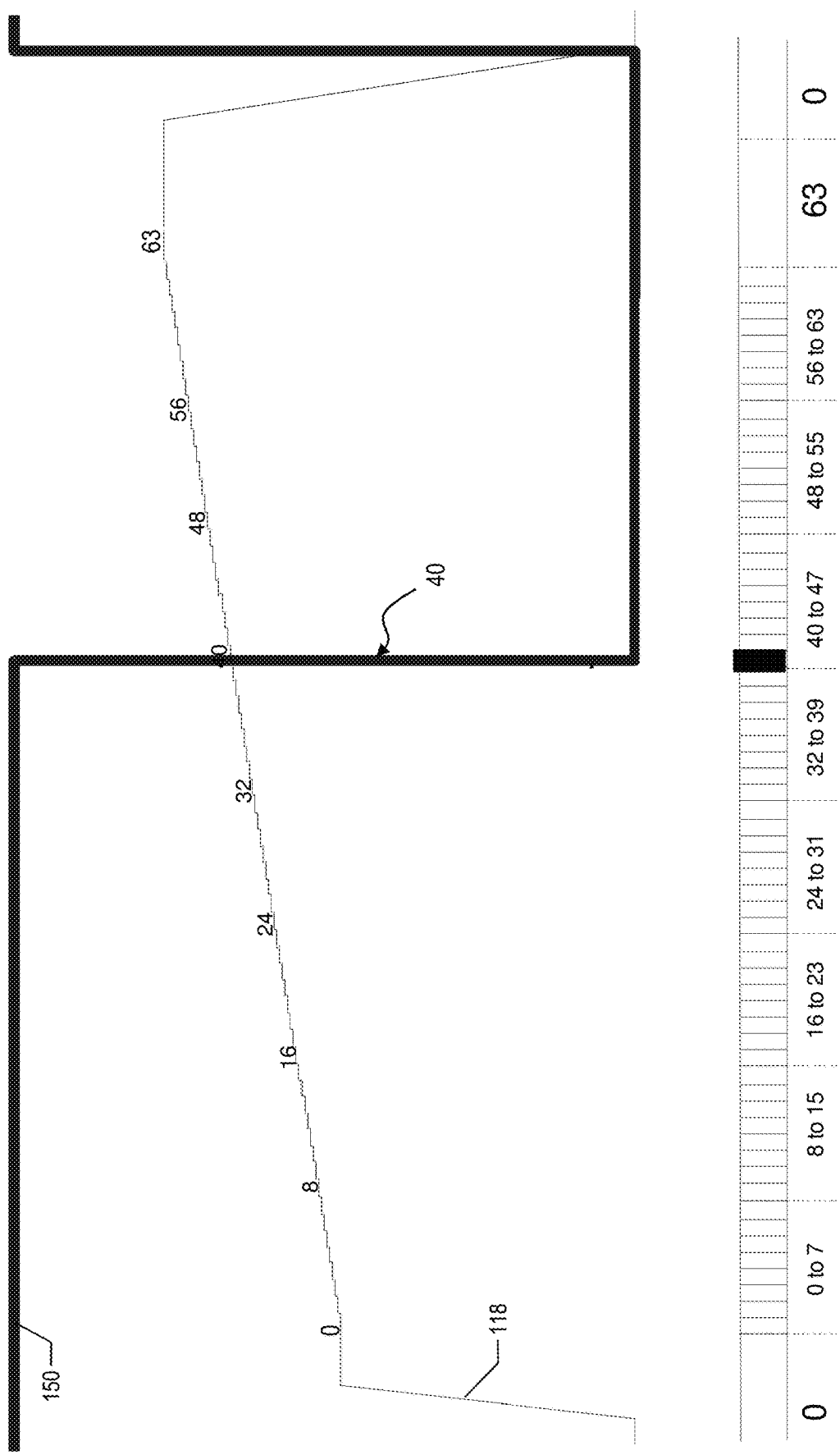

FIGS. 20 and 21 illustrate a sixth write iteration (e.g., step 757). Here, the system sets the write value to 35 (i.e., 100011), which is determined based on the difference between the value read 100111 in FIG. 19 (i.e. 39) and the target value 101000 (i.e., 40). That is, the three most significant bits of the read value (i.e., 100111) are not greater than or equal to target value (i.e., 101000). Thus, the system increases the previous write value from 100010 (i.e., 34) to 100011 (i.e., 35), by keeping the first, second, third, and fourth most significant bits and increasing the fifth-most significant bit of the previous write word, which increases the target value by 1.

FIG. 20 shows the sixth write operation (e.g., step 765), which stores the determined write value of 35 (i.e., 100011) in the storage cell. That is, the system triggers the write signal 345 such that it pulses at 35th time increment when a ramped write-reference voltage 318 is at a 35 step (i.e. step 100011) that corresponds to the 35 resistance state of the storage cell. FIG. 21 shows a sixth read operation (e.g., step 767) of the exemplary write process. The read output signal 150 switches states at step 40 of the read reference signal 118. Accordingly, the system determines that the value of storage cell is 40 (i.e., 101000 in binary). Notably, in this iteration, the read value equals the target value. Nevertheless, in accordance with aspects of the invention, the write operation continues since it does not rely on a difference between the target value and the read value to stop the process. Instead, it relies on the fact that the number of write iterations adjusts the stored value to a correct result.

Figure 22:
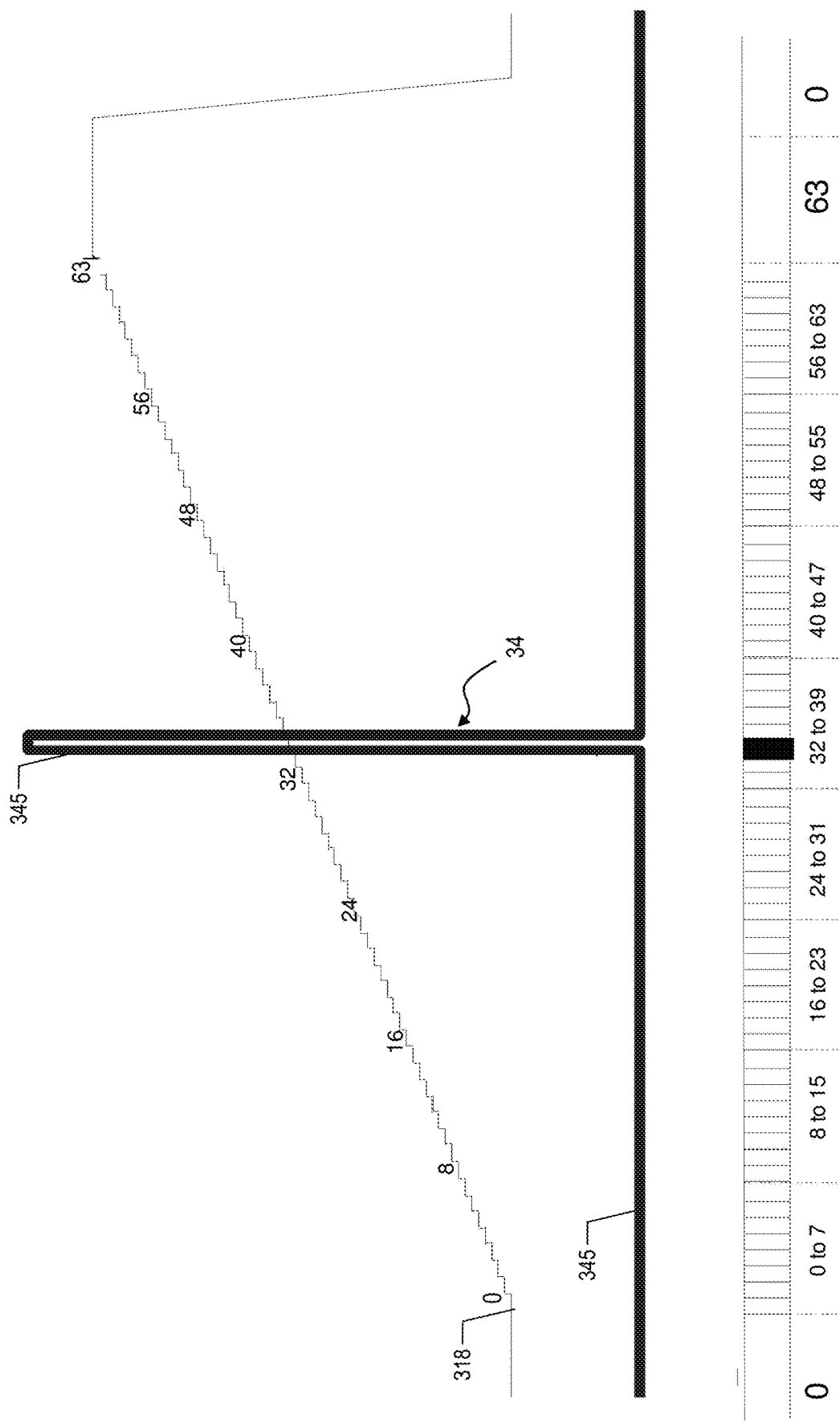

FIG. 22 shows a seventh, and final, write iteration (e.g., step 769) of the exemplary process. In this iteration, the system sets the write value to 34 (i.e., 100010), which is determined based on the difference between the value read 101000 in FIG. 21 (i.e. 40) and the target value 101000 (i.e., 40). That is, the three most significant bits of the read value (i.e., 101000) are greater than or equal to target value (i.e., 101000). Thus, the system decreases the previous write value from 100011 (i.e., 35) to 100010 (i.e., 34), by keeping the first, second, third, and fourth most significant bits and decreasing the fifth-most significant bit of the previous write word, which decreases the target value by 1. Accordingly, in the seventh write iteration (e.g., step 777) shown in FIG. 22, the system triggers the write signal 345 such that it pulses at 34th time increment when a ramped write-reference voltage 318 is at a 34th step (i.e. step 100010) that corresponds to the a 34th resistance state of the storage cell.

Figure 23:
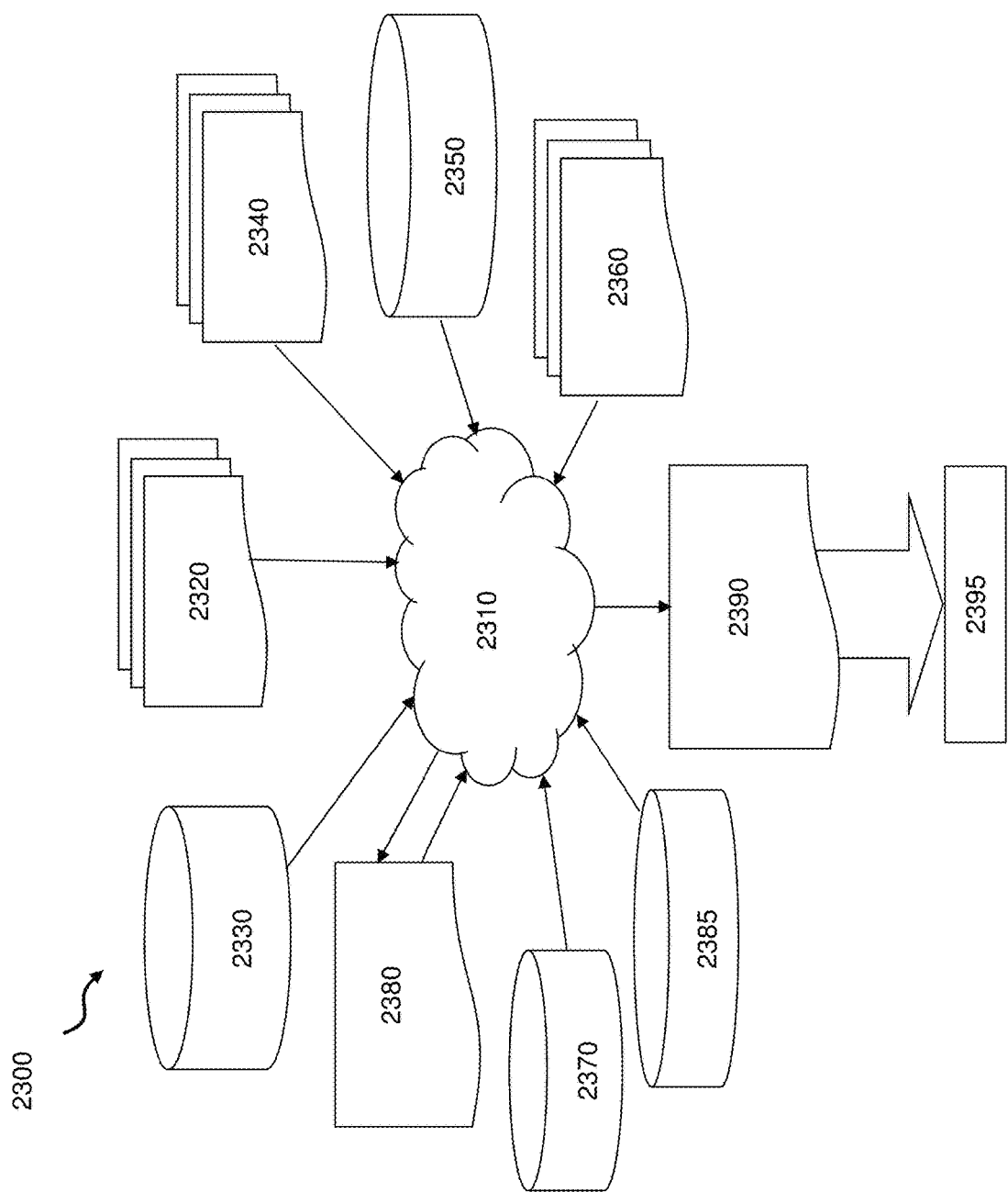
FIG. 23 shows a flow diagram of a design process used in semiconductor design, manufacture, and/or test.

FIG. 23 is a flow diagram of a design process used in semiconductor design, manufacture, and/or test. FIG. 23 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1, 3, and 5. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc.

FIG. 23 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1, 3, and 5. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2310 preferably employs and incorporates hardware and/or software modules for synthesizing, translating, or otherwise processing a design/simulation functional equivalent of the components, circuits, devices, or logic structures shown in FIGS. 1, 3, and 5 to generate a netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2310 may include hardware and software modules for processing a variety of input data structure types including netlist 2380. Such data structure types may reside, for example, within library elements 2330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2340, characterization data 2350, verification data 2360, design rules 2370, and test data files 2385 which may include input test patterns, output test results, and other testing information. Design process 2310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2310 without deviating from the scope and spirit of the invention. Design process 2310 may also include modules for performing standard circuit design processes such as timing analysis, verification, design rule checking, place and route operations, etc.

Design process 2310 employs and incorporates logic and physical design tools such as HDL compilers and simulation model build tools to process design structure 2320 together with some or all of the depicted supporting data structures along with any additional mechanical design or data (if applicable), to generate a second design structure 2390.

Design structure 2390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 2320, design structure 2390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 3, and 5. In one embodiment, design structure 2390 may comprise a compiled, executable HDL simulation model that functionally simulates the devices shown in FIGS. 1, 3, and 5.

Design structure 2390 may also employ a data format used for the exchange of layout data of integrated circuits and/or symbolic data format (e.g. information stored in a GDSII (GDS2), GL1, OASIS, map files, or any other suitable format for storing such design data structures). Design structure 2390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 3, and 5. Design structure 2390 may then proceed to a stage 2395 where, for example, design structure 2390: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method for a multi-bit phase change memory comprising establishing a write-reference voltage that incrementally ramps over a write period, wherein increments of the write-reference voltage correspond to predefined values stored in a storage cell of the multi-bit phase change memory.

2. The method of claim 1, wherein the establishing the write-reference voltage comprises generating a ramped current that increases in steps that correspond to respective ones of the predefined values.

3. The method of claim 1, wherein each increment has a respective voltage level.

4. The method of claim 1, further comprising:
   establishing a read-reference voltage that incrementally ramps over a read period; and
   determining a predefined value of the predefined values stored in the storage cell by comparing the read-reference voltage with a voltage across the storage cell due to a programmed resistance state of the storage cell.

5. The method of claim 4, wherein the determining the value stored in the storage cell comprises:
   determining an increment of the read period at which the read-reference voltage and the voltage across the storage cell are the same; and
   determining the value stored in the storage cell based on the increment of the read period.

6. The method of claim 1, further comprising translating an input value received by the multi-bit phase change memory into a target value that corresponds to one of the predefined values stored in the storage cell.

7. The method of claim 6, further comprising determining a write value to be written to the storage cell based on the target value and a value stored in the storage cell.

8. The method of claim 7, wherein the target value is based on a write value from a previous write iteration so as to iteratively adjust the target value over several write iterations.

9. The method of claim 1, wherein the predefined values correspond to discrete resistance states of the storage cell.

10. The method of claim 9, wherein the discrete resistance states can be divided so as to be grouped into buckets of ranges of values.

11. The method of claim 1, wherein the write-reference voltage is generated using a controllable current source.

12. The method of claim 1, wherein the write-reference voltage is generated using a digital to analog converter.

* * * * *